United States Patent
Ikeda et al.

(10) Patent No.: US 10,916,405 B2
(45) Date of Patent: Feb. 9, 2021

(54) ATOM PROBE INSPECTION DEVICE, FIELD ION MICROSCOPE, AND DISTORTION CORRECTION METHOD

(71) Applicant: TOSHIBA MEMORY CORPORATION, Minato-ku (JP)

(72) Inventors: Takahiro Ikeda, Yokohama (JP); Akira Kuramoto, Kuwana (JP); Haruko Akutsu, Yokosuka (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/562,931

(22) Filed: Sep. 6, 2019

(65) Prior Publication Data

US 2020/0286711 A1    Sep. 10, 2020

(30) Foreign Application Priority Data

Mar. 8, 2019   (JP) .................. 2019-042986

(51) Int. Cl.
 *H01J 37/285*   (2006.01)
 *H01J 37/244*   (2006.01)
 (Continued)

(52) U.S. Cl.
 CPC ............ *H01J 37/285* (2013.01); *H01J 37/12* (2013.01); *H01J 37/141* (2013.01);
 (Continued)

(58) Field of Classification Search
 CPC ........ H01J 37/12; H01J 37/141; H01J 37/153; H01J 37/244; H01J 37/285;
 (Continued)

(56) References Cited

U.S. PATENT DOCUMENTS 7,157,702 B2 * 1/2007 Gribb .................. B82Y 15/00
                                                          250/306
8,513,597 B2   8/2013 Panayi
(Continued)

FOREIGN PATENT DOCUMENTS

| CN | 1820347 A | 8/2006 |
| JP | 2008-215834 A | 9/2008 |
| JP | 4887344 B2 | 2/2012 |

OTHER PUBLICATIONS

Larson et al, "On the Use of Simulated Field-Evaporated Specimen Apex Shapes in Atom Probe Tomography Data Reconstruction", Microscopy and Microanalysis, vol. 18, No. 5, Oct. 2012 (Year: 2012).*

(Continued)

*Primary Examiner* — David E Smith
(74) *Attorney, Agent, or Firm* — Oblon, McClelland, Maier & Neustadt, L.L.P.

(57) ABSTRACT

According to one embodiment, an atom probe inspection device includes one or more processors configured to change a two-dimensional position of a detected ion, detect two-dimensional position information of the ion and a flying time of the ion, identify a type of an element of the ion, generate first information under a first condition and second information under a second condition, and generate a reconstruction image of the sample from the first information and the second information.

18 Claims, 24 Drawing Sheets

(51) Int. Cl.
*H01J 37/12* (2006.01)
*H01J 37/141* (2006.01)
*H01J 37/153* (2006.01)

(52) U.S. Cl.
CPC .......... *H01J 37/153* (2013.01); *H01J 37/244* (2013.01); *H01J 2237/153* (2013.01); *H01J 2237/226* (2013.01); *H01J 2237/2446* (2013.01); *H01J 2237/24495* (2013.01); *H01J 2237/24585* (2013.01); *H01J 2237/2611* (2013.01); *H01J 2237/2852* (2013.01); *H01J 2237/2855* (2013.01)

(58) Field of Classification Search
CPC .......... H01J 2237/153; H01J 2237/226; H01J 2237/2446; H01J 2237/24495; H01J 2237/24585; H01J 2237/2611; H01J 2237/2852; H01J 2237/2855
See application file for complete search history.

(56) References Cited

U.S. PATENT DOCUMENTS

| | | | | |
|---|---|---|---|---|
| 8,575,544 B1* | 11/2013 | Kelly | ............... | H01J 37/244 250/287 |
| 8,670,608 B2 | 3/2014 | Kelly | | |
| 2007/0215802 A1* | 9/2007 | Ward | ............... | H01J 37/28 250/309 |
| 2009/0152462 A1 | 6/2009 | Ishitani et al. | | |
| 2012/0080596 A1* | 4/2012 | Vandervorst | ......... | H01J 37/285 250/307 |
| 2015/0041652 A1* | 2/2015 | Akutsu | ............... | H01J 37/285 250/336.1 |
| 2019/0257855 A1* | 8/2019 | van der Heide | ...... | H01J 37/226 |

OTHER PUBLICATIONS

Bowkett, K. M. et al., "Field-Ion Microscopy," North-Holland Publishing Company, 1970, 13 pages.

Larson, D. J. et al., "On the Use of Simulated Field-Evaporated Specimen Apex Shapes in Atom Probe Tomography Data Reconstruction," Microscopy and Microanalysis, vol. 18, No. 5, Oct. 2012, 12 pages.

Parviainen, S. et al., "Atomistic simulations of field assisted evaporation in atom probe tomography," Journal of Physics D: Applied Physics, vol. 49, 2016, 9 pages.

Ohnuma, T. "Field evaporation simulation for high precision atom probe tomography—Effect of field evaporation and surface diffusion of iron and copper on field evaporation," Report Number: Q16004, Central Research Institute of Electric Power Industry, Apr. 2017, 39 pages (with English translation).

* cited by examiner

ATOM PROBE INSPECTION DEVICE, FIELD ION MICROSCOPE, AND DISTORTION CORRECTION METHOD

CROSS-REFERENCE TO RELATED APPLICATIONS

This application is based upon and claims the benefit of priority from Japanese Patent Application No. 2019-042986, filed on Mar. 8, 2019; the entire contents of which are incorporated herein by reference.

FIELD

Embodiments described herein relate generally to an atom probe inspection device, a field ion microscope, and a distortion correction method.

BACKGROUND

A field ion microscope (FIM) and an atom probe field ion microscope (APFIM) are known. The atom probe field ion microscope is used for identifying elements in a sample and analyzing a spatial distribution of the elements, using the principle of the field ion microscope. The FIM and the APFIM enable analysis of a composition in atomic level and are widely used in analysis of a semiconductor sample of a minute structure.

In the FIM or the APFIM, a focused ion beam (FIB) device directly applies a high electric field to a sample of a needle form in a vacuum state. Then, under the influence of the electric field, one atom or multiple atomic groups are discharged from the surface of the sample in the vacuum state by action of the electric field and reach a position sensitive detector located to oppose the end of the sample. Herein, a phenomenon that atoms are ionized by the electric field and separated from the surface of the sample is referred to as electric field evaporation. A direction from which a discharged ion has flown out of the end of the sample can be analyzed by solving a trajectory of the atom by a motion equation of the ion in the electric field. This can implement a reconstruction process for calculating the distribution of atoms in the sample corresponding to the detected ions. In such an analysis with the FIM or the APFIM, a reconstructed image may contain distortion due to a change in local magnification. The reasons for the distortion are, for example, that the end of the sample is not machined to a spherical crown shape, and that the sample made of different materials is changed in shape during the course of electric field evaporation to vary the local magnification at each position of the sample surface.

As such an APFIM, a moving method of the position sensitive detector is known, aiming for improving the yield of ions electrically evaporated radially.

However, the position sensitive detector is moved for the purpose of improving the yield of ions, so that such a method cannot correct the distortion of the reconstructed image.

In addition, methods for improving the accuracy of an image by combining images generated by different devices (for example, a transmission electron microscope (TEM) and APFIM) are known.

However, in such a method, it is hard to compare both samples differently cut in the middle of the electric field evaporation. In the case of samples including a minute device structure, a difference in local magnification occurs due to a difference in machined positions of the samples. In addition, error information on the local magnification obtained by such a method may not be reused for samples of different materials or structures. Further, the use of the multiple devices results in increasing the cost of the devices, and work including position adjustment between the devices cannot be simply performed.

DETAILED DESCRIPTION

According to one embodiment, in general, an atom probe inspection device includes one or more processors configured to change, between a first condition and a second condition, a two-dimensional position at which an ion that has been separated from a surface of a sample is detected on a detection surface of a position sensitive detector; detect two-dimensional position information of the ion detected on the detection surface and a flying time of the ion from the sample to the detection surface; identify a type of an element of the ion detected on the detection surface from the detected flying time; generate first information on the basis of a first two-dimensional position detected under the first condition and the type of the element and generate second information on the basis of a second two-dimensional position detected under the second condition and the type of the element; and generate a reconstruction image of the sample on the basis of the first information generated and the second information generated.

Hereinafter, an atom probe inspection device, a field ion microscope, and a distortion correction method according to exemplary embodiments will be described in detail with reference to the accompanying drawings. The invention is not limited to these embodiments.

First Embodiment

Figure 1:
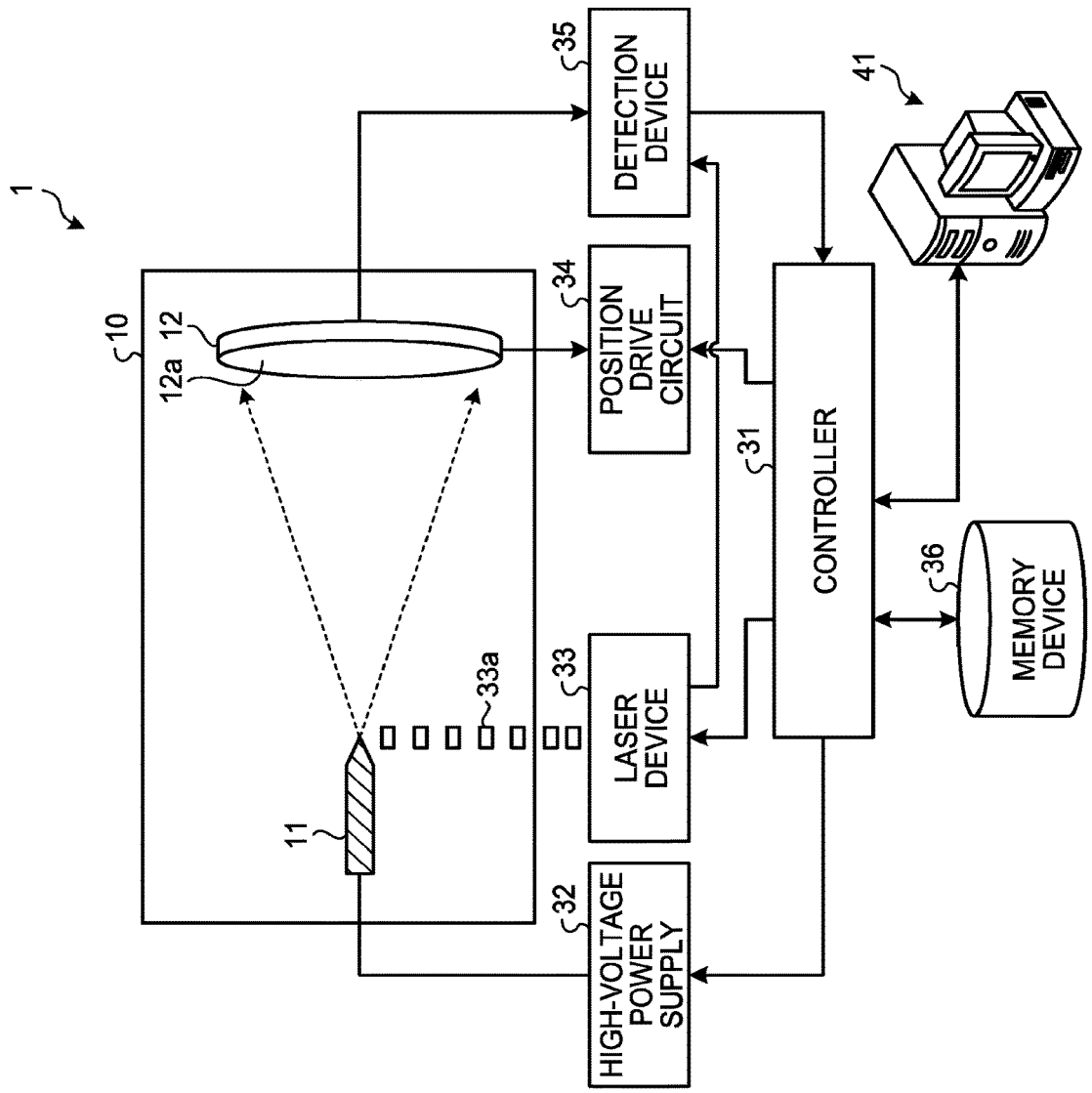
FIG. 1 is a diagram illustrating an exemplary configuration of an atom probe inspection device according to a first embodiment.

FIG. 1 is a diagram illustrating an exemplary configuration of an atom probe inspection device according to a first embodiment. The entire configuration of an atom probe inspection device 1 according to this embodiment will be described with reference to FIG. 1.

As illustrated in FIG. 1, the atom probe inspection device 1 according to this embodiment includes a position sensitive detector 12, a controller 31, a high-voltage power supply 32, a laser device 33, a position drive circuit 34, a detection device 35, and a memory device 36.

The position sensitive detector 12 two-dimensionally detects ions, on the detection surface 12a, separated from the end of a sample 11 by electric field evaporation in a vacuum chamber 10. Herein, the sample 11 is formed of a material of a certain element (for example, Si or $SiO_2$) into a needle form by machining with the above-described FIB device. In FIG. 1, for the convenience of explanation, the size of the sample 11, the size of the position sensitive detector 12, and a distance between the sample 11 and the position sensitive detector 12 are illustrated as substantially the same size. However, in an actual device, the length of the sample 11 is several [μm], the diameter of a spherical crown shape of the end is several [nm] to 10 [nm], and the distance between the sample 11 and the position sensitive detector 12 and the radius of the detection surface 12a of the position sensitive detector 12 are about 10 [cm].

The controller 31 controls the entire atom probe inspection device 1. Specifically, the controller 31 controls the operations of the high-voltage power supply 32, the laser device 33, and the position drive circuit 34, and performs a reconstruction process in which a distribution (positions) of atoms on the surface of the sample 11 is calculated from the information obtained by the detection device 35 to generate an image. In addition, the controller 31 arranges the images of the distribution of the atoms on the surface of the sample 11 chronologically so as to generate a three-dimensional map representing the three-dimensional distribution of atoms of the sample 11.

The high-voltage power supply 32 is a power supply device which applies a high voltage to the sample 11 in the vacuum chamber 10 to apply a high electric field between the sample 11 and the position sensitive detector 12. The high-voltage power supply 32 steadily applies a voltage to generate an electric field slightly lower than an evaporation electric field of the sample 11 for example. Then, as described below, the atoms of the sample 11 are evaporated in the electric field at timing when the laser device 33 emits a laser pulse to the end of the sample 11.

Further, the voltage application of the high-voltage power supply 32 is not limited to the above example. For example, the voltage may be applied in pulse form to generate an electric field larger than at least the evaporation electric field of the sample 11. In this case, the laser emission of the laser device 33 to the sample 11 is not necessary. The atoms of the sample 11 are evaporated in the electric field at timing when the voltage pulse is applied by the high-voltage power supply 32.

The laser device 33 is a laser emission device which emits a laser to the end of the sample 11 in the vacuum chamber 10. Specifically, the laser device 33 emits a pulse laser 33a of a pulse form to the end of the sample 11 as illustrated in FIG. 1. The atoms on the surface of the sample 11 is irradiated and excited with the pulse laser 33a from the laser device 33, ionized by the electric field evaporation, and separated.

The position drive circuit 34 is a drive circuit to move the position of the position sensitive detector 12 under the control of the controller 31. Specifically, the position drive circuit 34 moves the position sensitive detector 12 in a linear direction connecting the end of the center of the detection surface 12a to change the distance from the end of the sample 11 to the detection surface 12a of the position sensitive detector 12. More specifically, the position sensitive detector 12 is fixed to an actuator which actually moves the position. The actuator is driven by a drive signal from the position drive circuit 34 so as to move the position sensitive detector 12. As the actuator, a piezoelectric element or a gel element expandable and shrinkable in volume is desirably used in order to avoid occurrence of dust.

The detection device 35 is a device which finds the two-dimensional position information of the ion detected by the position sensitive detector 12 and the flying time (hereinafter, this may be referred to as Time Of Flight (TOF)) of the ion from the sample 11 to the detection surface 12a, and outputs the information to the controller 31. For example, the detection device 35 receives information on pulse timing upon output of each pulse of the pulse laser 33a from the laser device 33, and can calculate the TOF of the ion on the basis of the reception time and the time when the ion is detected.

The memory device 36 is a device which stores various types of data. For example, the memory device 36 accumulates the images reconstructed by the controller 31. The memory device 36 represents a hard disk drive (HDD) or a solid state drive (SSD), and may be included in the controller 31 although being located outside of the controller 31 in FIG. 1.

An information processing device 41 receives the image reconstructed by the controller 31 and the three-dimensional map, and performs various types of analysis using these inputs.

The configuration of the atom probe inspection device 1 illustrated in FIG. 1 is merely exemplary. The atom probe inspection device 1 may include, for example, components other than the components illustrated in FIG. 1.

Figure 2:
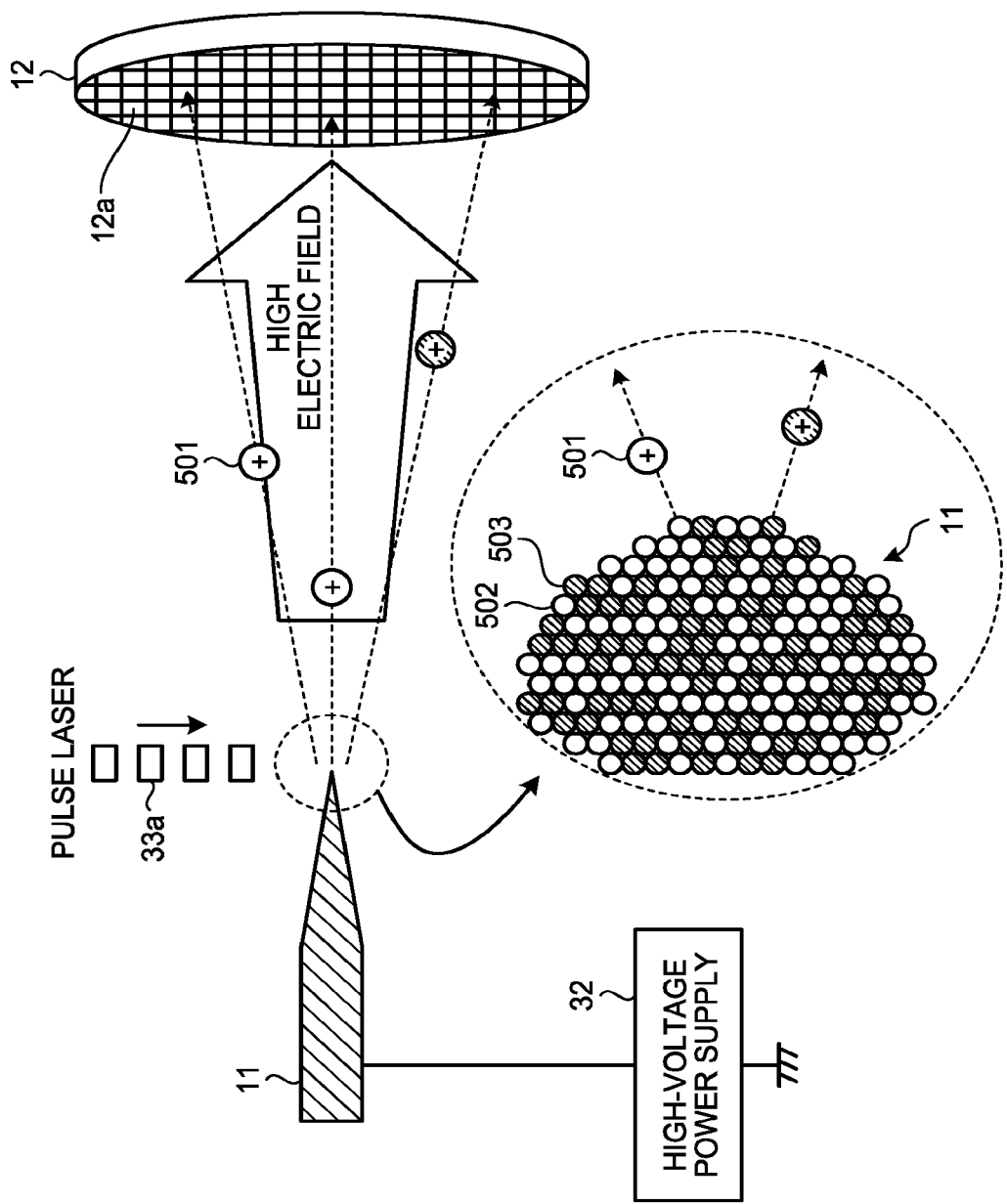
FIG. 2 is a diagram for illustrating the outline of the operation of the atom probe inspection device according to the first embodiment.

FIG. 2 is a diagram for illustrating the outline of the operation of the atom probe inspection device according to the first embodiment. The schematic operation of the atom probe inspection device 1 according to this embodiment will be described with reference to FIG. 2.

As illustrated in FIG. 2, the end of the sample 11 is machined to a needle shape by the FIB device. The sample 11 is made of a material containing one or more given elements. FIG. 2 illustrates atoms 502 as a certain element and atoms 503 as another element, for example. The high-voltage power supply 32 applies a high voltage to the sample 11 in the vacuum chamber 10 to generate a high electric field between the sample 11 and the position sensitive detector 12.

In this state, the laser device 33 emits the pulse laser 33a to the end of the sample 11, exciting the atoms 502 and 503 and ionizing them by electric field evaporation. Then, the atoms 502 and 503 turn to an ion 501 and the ion is separated from the sample 11 toward the position sensitive detector 12. As illustrated in FIG. 2, the ion 501, separated from the end of the sample 11, flies radially, but it actually flies in a slightly curved manner rather than linearly due to a Lorentz force of the high electric field by the high voltage applied to the sample 11. However, hereinbelow, the ion separated by the electric field evaporation is assumed to fly linearly for the sake of simple explanation.

The ion 501 flies from the sample 11 by the electric field evaporation and reaches the detection surface 12a of the position sensitive detector 12, and the two-dimensional position information on the detection surface 12a is detected. As described above, the detection device 35 receives information on pulse timing upon output of each pulse of the pulse laser 33a from the laser device 33, for example, and calculates the TOF of the ion on the basis of the reception time and the time at which the ion is detected.

Next, the controller 31 calculates a ratio m/z between a mass number and a charge number of the ion of the atom separated from the sample 11 by a motion equation of the ion in the electric field using the TOF calculated by the detection device 35, and performs a mass analysis to identify an element of the material of the sample 11 according to the ratio m/z. The ion separated from the sample 11 by the emission of the pulse laser 33a is not a single ion as illustrated in FIG. 2, but an atomic group of ions may be separated. In this case, the controller 31 can identify an element contained in the atomic group by analyzing the spectrum of the calculated ratio m/z.

Then, the controller 31 reconstructs an image representing the distribution (positions) of the atoms on the surface of the sample 11 according to the position information detected by the detection device 35 and the type of the element identified as a result of the mass analysis. Further, the controller 31 can generate a three-dimensional map representing a three-dimensional distribution of atoms of the sample 11 by arranging the reconstructed images of the atomic distribution of the surface of the sample 11 in time series.

Figure 3:
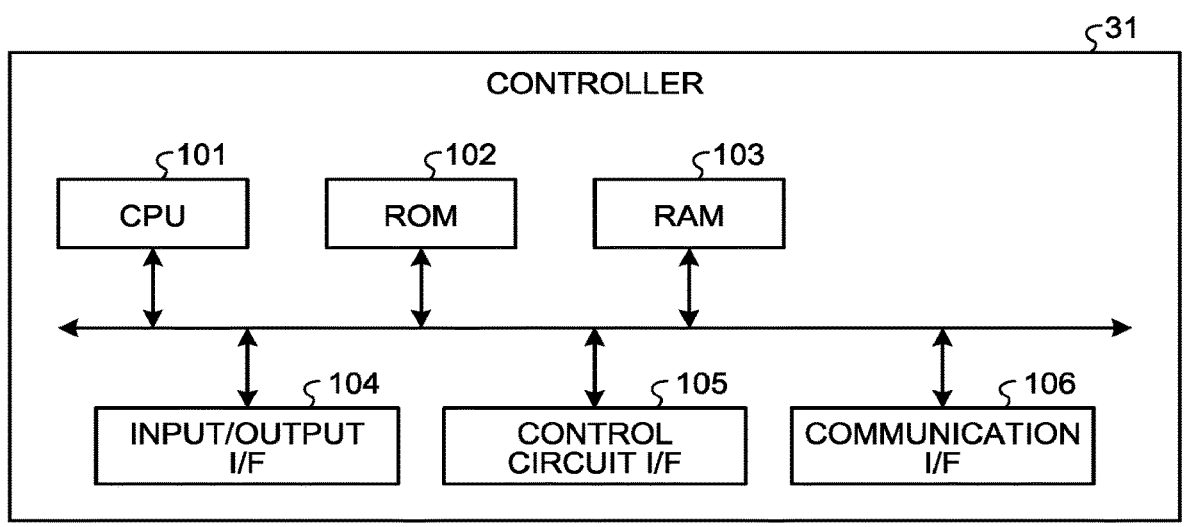
FIG. 3 is a diagram illustrating an exemplary hardware configuration of a controller in the first embodiment.

FIG. 3 is a diagram illustrating an exemplary hardware configuration of the controller in the first embodiment. The hardware configuration of the controller 31 in this embodiment will be described with reference to FIG. 3.

As illustrated in FIG. 3, the controller 31 includes a central processing unit (CPU) 101, a read only memory (ROM) 102, a random access memory (RAM) 103, an input/output I/F 104, a control circuit I/F 105, and a communication I/F 106 which are connected to communicate with each other through a bus.

The CPU 101 is a computational device which controls the entire operation of the controller 31 and the entire operation of the atom probe inspection device 1. The ROM 102 is a non-volatile memory device which stores a program such as firmware with which the CPU 101 controls the functions. The RAM 103 is a volatile memory used as a work area of the CPU 101.

The input/output I/F 104 is an interface through which data is input and output with respect to the memory device 36 outside the controller 31.

The control circuit I/F 105 is an interface which transfers control data and detection data including an operation command with respect to the high-voltage power supply 32, the laser device 33, the position drive circuit 34, and the detection device 35.

The communication I/F 106 is an interface to perform data communication through an external device (for example, information processing device 41) and the network. For example, the communication I/F 106 is adaptable to the Internet (registered trademark), and enables communication in conformity with Transmission Control Protocol (TCP)/Internet Protocol (IP).

The hardware configuration of the controller 31 illustrated in FIG. 3 is merely exemplary, and the controller 31 may include components other than the components illustrated in FIG. 3.

Figure 4:
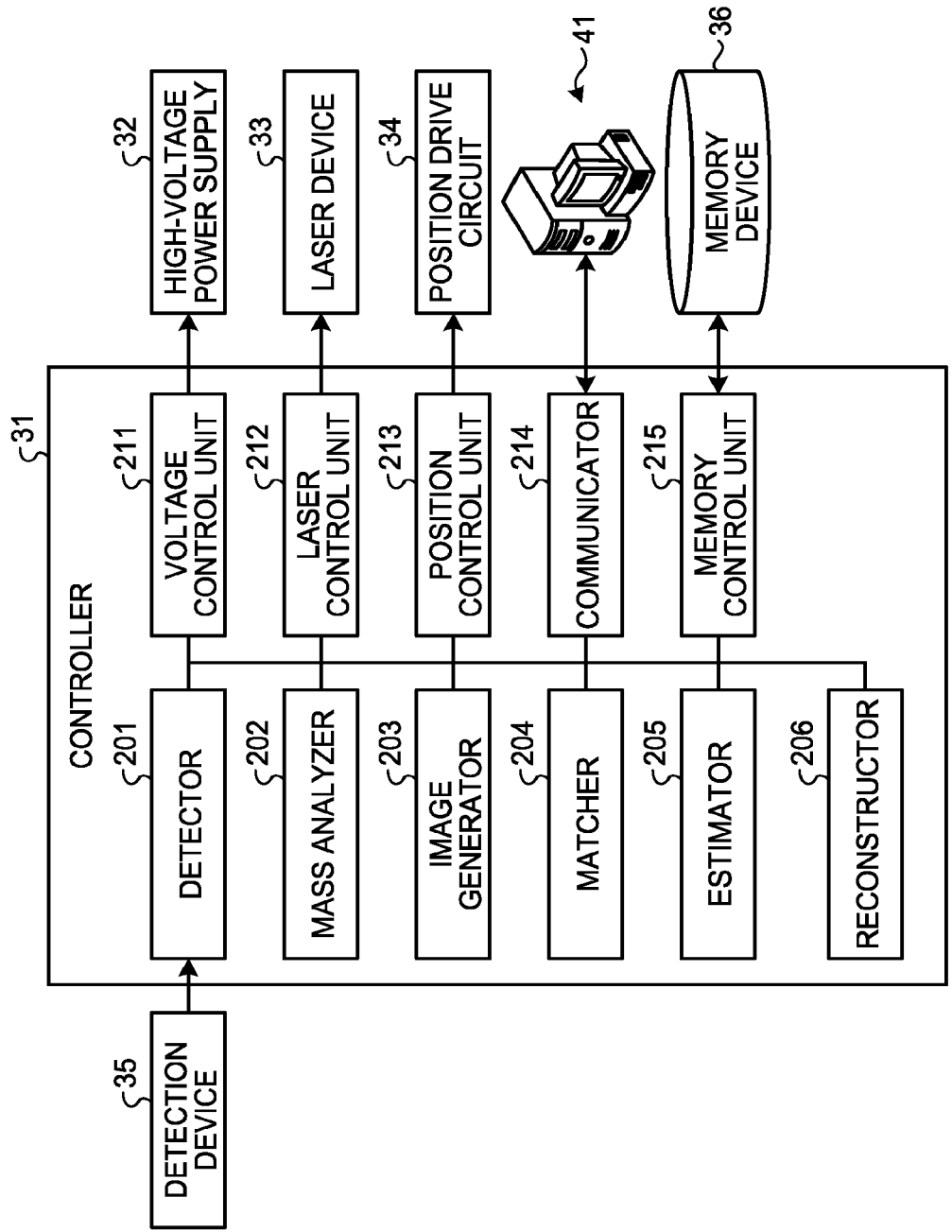
FIG. 4 is a diagram illustrating an exemplary configuration of functional blocks of the controller in the first embodiment.

FIG. 4 is a diagram illustrating an exemplary configuration of functional blocks of the controller in the first embodiment. The configuration and the operation of the functional blocks of the controller 31 in this embodiment will be described with reference to FIG. 4.

As illustrated in FIG. 4, the controller 31 according to this embodiment includes a detector 201, a mass analyzer 202, an image generator 203, a matcher 204, an estimator 205, a reconstructor 206, a voltage control unit 211, a laser control unit 212, a position control unit 213, a communicator 214, and a memory control unit 215. These units represent commands executable by the CPU or one or more processors and stored in a storage medium to be read by an integrated circuit and/or a computer, and part of them may be able to perform the following processing.

The detector 201 is a functional unit for acquiring two-dimensional position information of the ion detected by the position sensitive detector 12 and the TOF of the ion to the detection surface 12a from the sample 11 as detection information from the detection device 35. The detector 201 is implemented by the CPU 101's executing the program and the input/output I/F 104 illustrated in FIG. 3.

The mass analyzer 202 is a functional unit which calculates the ratio m/z between the mass number and the charge number of the ion of the atom separated from the sample 11 from the motion equation of the ion in the electric field using the TOF acquired by the detector 201, and performs the mass analysis to identify an element of the material of the sample 11 from the ratio m/z. The mass analyzer 202 is implemented by the CPU 101's executing the program illustrated in FIG. 3.

The image generator 203 is a functional unit which generates or reconstructs an image representing the distribution of the atoms on the surface of the sample 11 according to the two-dimensional position information of the ion acquired by the detector 201 and the information of the element of the ion identified by the mass analyzer 202. Specifically, the image generator 203 labels each element of the ion corresponding to each pixel in the image reconstructed on the basis of the two-dimensional position information of the ion. As a method of labeling, a number uniquely identifying the element is assigned as a pixel value of each pixel, or a different color value is assigned to each element. The image generator 203 is implemented by the CPU 101 in FIG. 3 performing a program.

The matcher 204 is a functional unit which performs feature matching of two images reconstructed by the image generator 203 on the basis of the detection information obtained by the detection device 35 at two positions of the position sensitive detector 12, which is controlled in position by the position control unit 213 as described below. Herein, the feature matching refers to processing by which feature amounts extracted from positions of different images are associated with each other. Examples of algorithm for extracting the feature amount used in the feature matching include Histograms of Oriented Gradients (HOG), Difference of Gaussian (DoG), Harris corner detection, Scale-Invariant Feature Transform (SIFT), Speeded-Up Robust Features (SURF), and Oriented FAST and Rotated BRIEF (ORB). Corresponding points are subjected to matching estimation of a Euclidean distance from the feature amount extracted by these algorithms. The matcher 204 is implemented by the CPU 101's performing the program in FIG. 3.

The estimator 205 is a functional unit which calculates a distortion amount of corresponding locations in two images on the basis of the result of the feature matching of the two images by the matcher 204, and calculates a trajectory of the ion from the distortion amount to estimate the center of a curvature circle at the point on the sample 11 from which the ion corresponding to the location has been separated. The estimator 205 is implemented by the CPU 101's executing the program illustrated in FIG. 3.

The reconstructor 206 is a functional unit which reconstructs the image representing the distribution of the atoms on the surface of the sample 11 using the two-dimensional position information of the ion acquired by the detector 201, the information of the element of the ion identified by the mass analyzer 202, and the information of the center of the curvature circle of each ion estimated by the estimator 205. In other words, the image reconstructed by the reconstructor 206 is a distortion-corrected image of the image generated by the image generator 203. In addition, the reconstructor 206 arranges the reconstructed images of the distribution of the atoms on the surface of the sample 11 chronologically so as to generate a three-dimensional map representing the three-dimensional distribution of atoms of the sample 11. The reconstructor 206 is implemented by the CPU 101's executing the program illustrated in FIG. 3.

The voltage control unit 211 is a functional unit which controls the operation of the high-voltage power supply 32 to control the application of a high voltage to the sample 11. The voltage control unit 211 is implemented by the CPU 101's executing the program illustrated in FIG. 3.

The laser control unit 212 is a functional unit which controls the operation of the laser device 33 to control the emission of the laser to the end of the sample 11. The laser control unit 212 is implemented by the CPU 101's executing the program illustrated in FIG. 3.

The position control unit 213 is a functional unit which controls the operation of the position drive circuit 34 to control the operation of moving the position sensitive detector 12. The position control unit 213 is implemented by the CPU 101's executing the program illustrated in FIG. 3.

The communicator 214 is a functional unit which performs data communication with the information processing device 41 through a network. The communicator 214 is implemented by the communication I/F 106 illustrated in FIG. 3.

The memory control unit 215 is a functional unit which controls the input/output of data with respect to the memory device 36. The memory control unit 215 is implemented by the input/output I/F 104 illustrated in FIG. 3.

Further, part or all of the detector 201, the mass analyzer 202, the image generator 203, the matcher 204, the estimator 205, the reconstructor 206, the voltage control unit 211, the laser control unit 212, and the position control unit 213 may be implemented by hardware circuitry such as field-programmable gate array (FPGA) or application certain integrated circuit (ASIC) instead of a software program.

The functional units of the controller 31 illustrated in FIG. 4 are conceptual functions, are not limited to such a configuration. For example, the plurality of independent functional units of the controller 31 illustrated in FIG. 4 may be one functional unit. The function of one functional unit in the controller 31 illustrated in FIG. 4 may be divided into a plurality of functions serving as a plurality of functional units.

Figure 5:
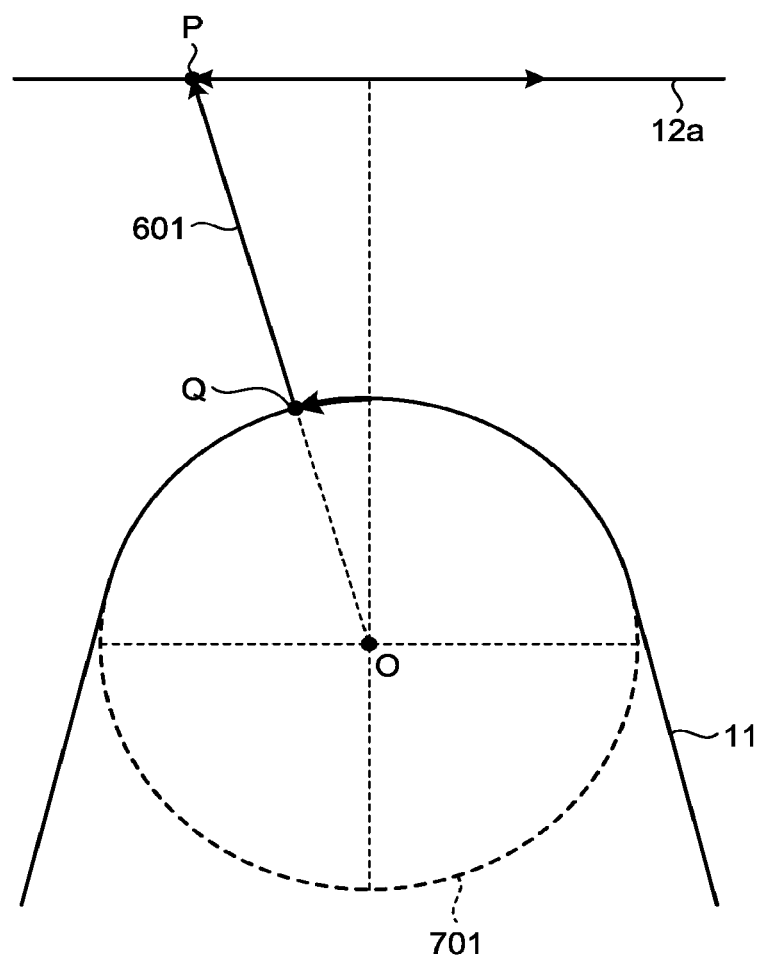
FIG. 5 is a diagram for illustrating a detection of a sample of a spherical crown shape.

FIG. 5 is a diagram for illustrating a detection of a sample of a spherical crown shape. The behavior of the ion from the sample 11 with the end of an ideal spherical crown shape will be described with reference to FIG. 5.

As illustrated in FIG. 5, in the case of the sample 11 with the end of an ideal spherical crown shape, the atom located at point Q on the surface of the sample 11 is ionized by a high applied voltage and excited by the laser, and is separated from the sample 11. Separated from the sample 11, the ion flies along a trajectory 601, and reaches point P on the detection surface 12a of the position sensitive detector 12.

That is, the direction of the ion away from point Q, that is, a direction of the trajectory 601 coincides with a direction of the straight line connecting point Q and the center O of the curvature circle of point Q (that is, a direction of a normal vector at point Q of the curvature circle). Herein, the curvature circle of point Q coincides with a circle 701 of a spherical crown shape since the end of the sample 11 has a spherical crown shape.

Figure 6:
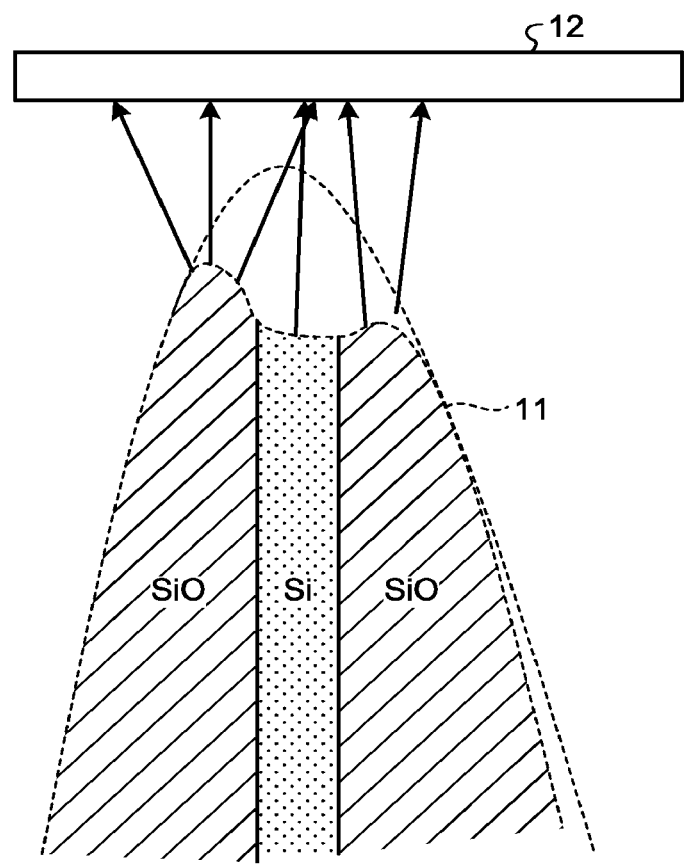
FIG. 6 is a diagram for illustrating a sample of a non-spherical crown shape.
Figure 7:
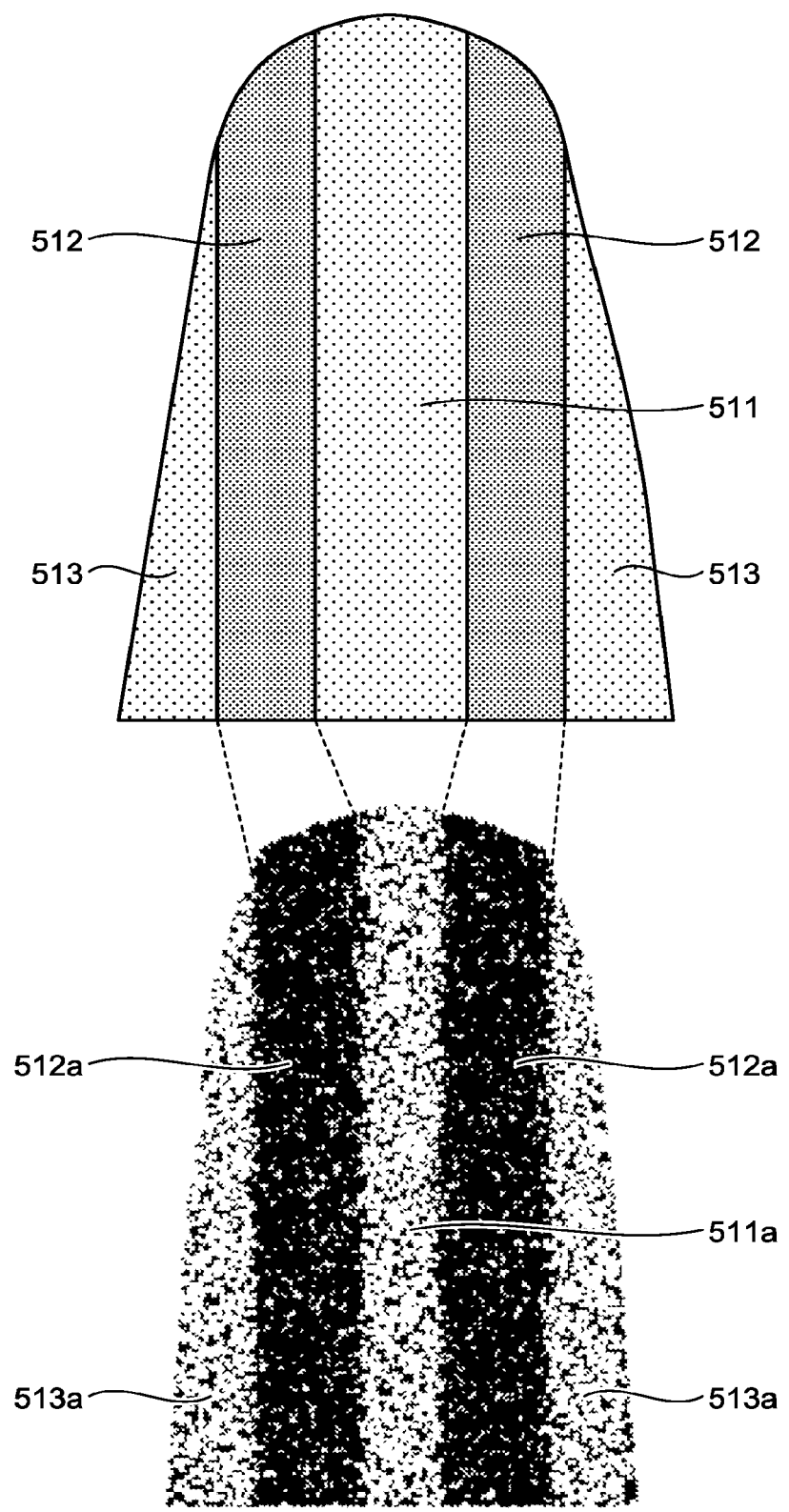
FIG. 7 is a diagram for comparing an actual shape of the sample and a reconstructed image.

FIG. 6 is a diagram for illustrating a sample of a non-spherical crown shape. FIG. 7 is a diagram for comparing an actual shape of the sample and the reconstructed image. Next, a description will be given of the sample 11 with the end of a non-spherical crown shape, with reference to FIGS. 6 and 7.

As described above, a phenomenon may occur that a distortion occurs in an image reconstructed by the analysis such as APFIM. The reason why such a phenomenon occurs is because the shape of the end of the sample is not an ideal spherical crown shape, that is, a shape of a plane-cut sphere but a shape with different curvature at each position of the surface of the sample, and an image portion of a sharp location with a large curvature is expanded more than the rest of the image. In addition, there are mainly two reasons why the end of the sample is not formed into a spherical crown shape. The first reason is derived from a machining result of the sample which is performed before the analysis. The second reason is derived from the sample 11 made of different materials (Si, $SiO_2$) of a plurality of evaporation electric fields as illustrated in FIG. 6 for example. In this case, in the progress of field evaporation, a material (Si in the example of FIG. 6) having a low evaporation electric field is first to be evaporated in the electric field, and a material (SiO$_2$ in the example of FIG. 6) having a high evaporation electric field is delayed in the electric field evaporation. As a result, as illustrated in FIG. 6, the end of the sample 11 is changed from the spherical crown shape to a shape with a different local magnification at each position of the surface. The surface from which the curvature of the material having a high evaporation electric field is exposed becomes large.

FIG. 7 illustrates an exemplary reconstructed image of the sample having changed in shape from the spherical crown shape (hereinafter, may be simply referred to as reconstruction image). The upper part of FIG. 7 illustrates a cross-sectional view of the sample made of a first material 511, a second material 512, and a third material 513. Along with progress of the electric field evaporation of the sample, the first material 511 having a lower evaporation electric field is evaporated first, and the second material 512 having a higher evaporation electric field is evaporated with a delay to change the sample in shape from the spherical crown shape. The ion evaporated by the electric field is detected from such a shape to reconstruct an image representing the distribution of the atoms on the surface of the sample, which is illustrated in the lower part of FIG. 7. The image illustrated in the lower part of FIG. 7 is a cross-sectional view of a three-dimensional map representing the three-dimensional distribution of atoms of the sample, generated from the reconstructed images of the atomic distribution on the surface of the sample and arranged in time series, taken along a plane in parallel to the arrangement. A first material image 511a illustrated in FIG. 7 corresponds to the first material 511, a second material image 512a corresponds to the second material 512, and a third material image 513a corresponds to the third material 513. As a result of changing the shape of the sample from the spherical crown shape, in FIG. 7, the first material 511 having a local magnification is drawn thinner as illustrated by the first material image 511a, and the second material 512 having a lower local image magnification is drawn larger as with the second material image 512a. In other words, the reconstruction image for the three-dimensional map illustrated in FIG. 7 includes a distortion in the distribution of the materials by the change in the local magnification.

Figure 8:
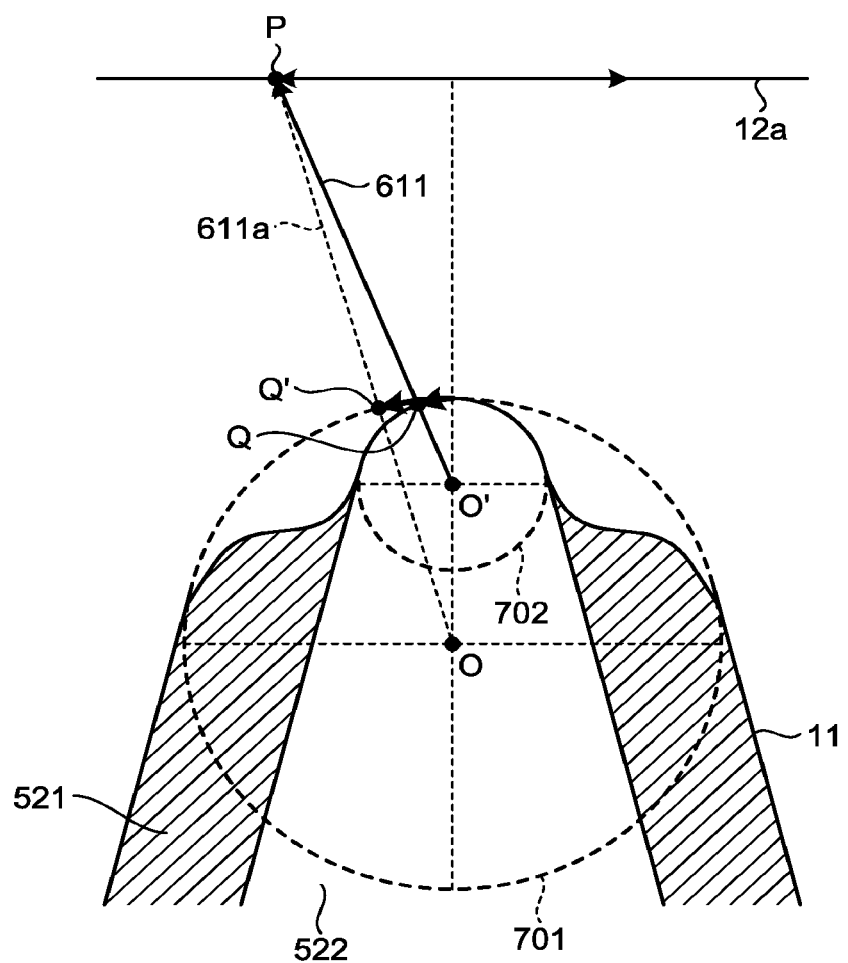
FIG. 8 is a diagram for illustrating an influence of a change in local magnification.

FIG. 8 is a diagram for illustrating an influence of a change in local magnification. The description will be given with reference to FIG. 8 about a principle that the reconstruction images in FIGS. 6 and 7 include a distortion.

The sample 11 illustrated in FIG. 8 is made of materials 521 and 522, and the evaporation electric field of the material 521 is larger than the evaporation electric field of the material 522. As a result, along with progress of the electric field evaporation of the sample 11, the material 521 progresses in the electric field evaporation faster than the material 522. Thus, as illustrated in FIG. 8, the material 522 in the center protrudes further than the material 521, and forms into a shape with a local magnification (large curvature).

In this case, the trajectory of the ion detected at point P on the detection surface 12a of the position sensitive detector 12 is actually a trajectory 611 passing point O' which is the center of a circle 702 which is the curvature circle at point Q where the atom (the base of the ion) is located. However, the trajectory is estimated as a trajectory 611a passing point O which is the center of the circle 701 of the spherical crown shape. Then, the position on the sample 11 of the atom (the base of the ion) is erroneously reconstructed as being point Q' although the location is originally point Q. As a result, the image of the material 522 reconstructed larger than the original size, that is, the reconstruction image containing distortion, is generated.

Figure 9:
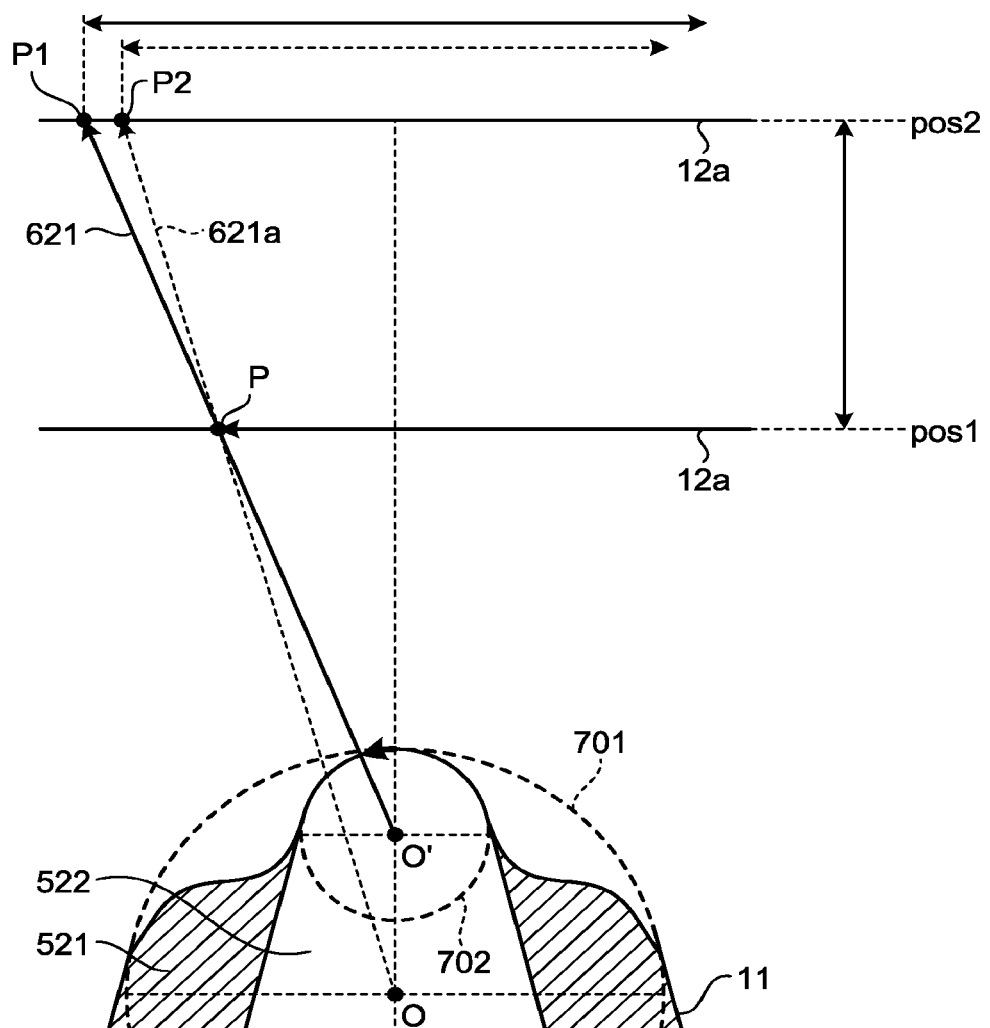
FIG. 9 is a diagram for illustrating moving a position sensitive detector in the first embodiment.
Figure 10:
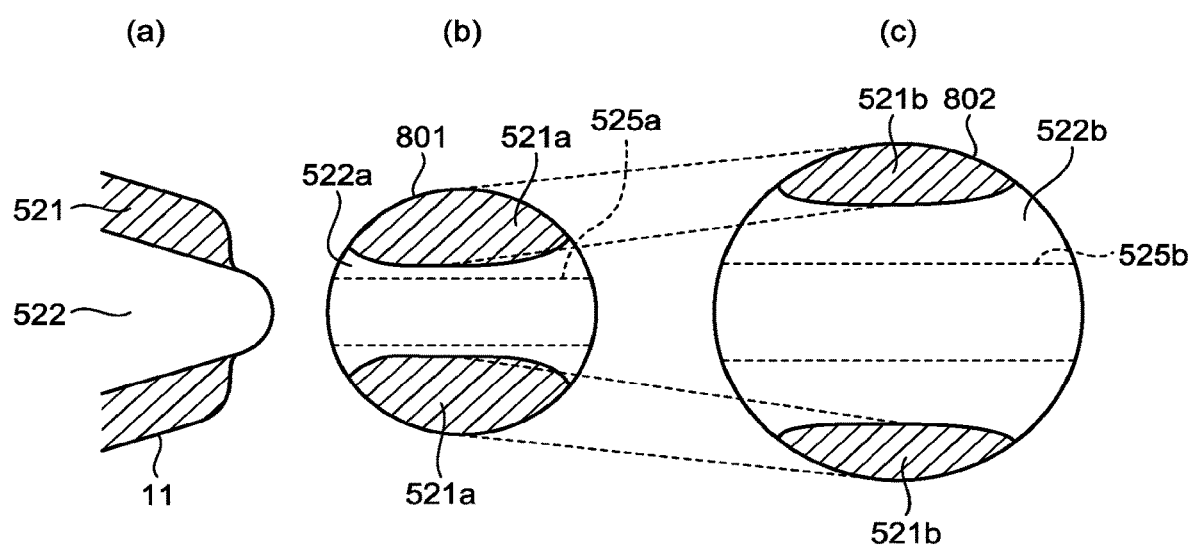
FIG. 10 is a diagram for comparing images detected at two positions.

FIG. 9 is a diagram for illustrating an operation of moving the position sensitive detector in the first embodiment. FIG. 10 is a diagram for comparing the images detected at two positions. The following will describe the operation of the atom probe inspection device 1 according to this embodiment to generate a distortion-corrected reconstruction image with reference to FIGS. 9 and 10.

As described above, the position sensitive detector 12 is configured to move the position by the position drive circuit 34. First, the description will be given about an example that the position of the position sensitive detector 12 is a position pos1 illustrated in FIG. 9. Further, the shape of the sample 11 illustrated in FIG. 9 is similar to the shape of the sample 11 illustrated in FIG. 8. In this case, the trajectory of the ion detected at point P on the detection surface 12a of the position sensitive detector 12 is a trajectory 621 passing point O' which is the center of a circle 702 which is the curvature circle at a location where the atom (the base of the ion) is located. However, the trajectory is estimated as a trajectory 621a passing point O which is the center of the circle 701 along the spherical crown shape. Then, the position on the sample 11 of the atom (the base of the ion) is erroneously reconstructed as being on point Q' although the location is originally point Q. As a result, the image of the material 522 reconstructed larger than the original size (that is, the reconstruction image containing distortion) is obtained as an image 801 illustrated in FIG. 10(b). Further, the sample 11 illustrated in (a) of FIG. 10 is rotated by 90° from the sample 11 in FIG. 9 in the plane, for comparison with the image.

In the image 801 illustrated in (b) of FIG. 10, an image portion 521a corresponds to the material 521, and the image portion 522a corresponds to the material 522. An ideal boundary 525a represents a boundary between the material 521 and the material 522 of the sample 11 of an ideal spherical crown shape in the image reconstructed at the position pos1 of the position sensitive detector 12. In the image 801, the image portion 521a and the image portion 522a are offset to outside from the ideal boundary 525a, and the image portion 522a corresponding to the material 522 is reconstructed as larger than the original size.

Next, the following describes an example that the position sensitive detector 12 is moved by the position drive circuit 34 to a position pos2 illustrated in FIG. 9. In this case, having flown along the trajectory 621, the ion reaches point P1 on the detection surface 12a of the position sensitive detector 12. Meanwhile, supposed that the ion have flown along the trajectory 621a, the ion would reach point P2 on the detection surface 12a. (c) of FIG. 10 depicts an image 802 which is the reconstructed image on the basis of the two-dimensional position information of the ion detected by the position sensitive detector 12 at the position pos2.

In the image 802 illustrated in (c) of FIG. 10, an image portion 521b corresponds to the material 521, and an image portion 522b corresponds to the material 522. An ideal boundary 525b represents a boundary between the material 521 and the material 522 of the sample 11 with an ideal spherical crown shape in the image reconstructed at the position pos2 of the position sensitive detector 12. In the image 802, the image portion 522b corresponding to the material 522 is more expanded in size than the image portion 521b corresponding to the material 521 than in the image 801.

The two reconstruction images 801 and 802, containing a distortion different from the original distribution of the atoms, are subjected to the feature matching. Through the feature matching, it is possible to associate the positions of the boundaries between both materials in the images 801 and 802 with each other. Through the feature matching, it is possible to associate the positions of the boundaries between the image portion corresponding to the material 521 and the image portion corresponding to the material 522 with each other. Then, the distortion amounts of the locations (for example, in the boundary of the materials) in two reconstruction images are calculated from the result of the feature matching. By calculating the trajectory of the ion from the distortion amounts, the center (point O' in the example of FIG. 9) of the curvature circle at the point on the sample 11 from which the ion at the location has been separated can be estimated. The distortion is corrected by the reconstruction using the estimated center of the curvature circle at the point on the sample 11 from which the ion has been separated. Thereby, the distortion-corrected reconstruction image with no error due to the local magnification can be generated.

Figure 11:
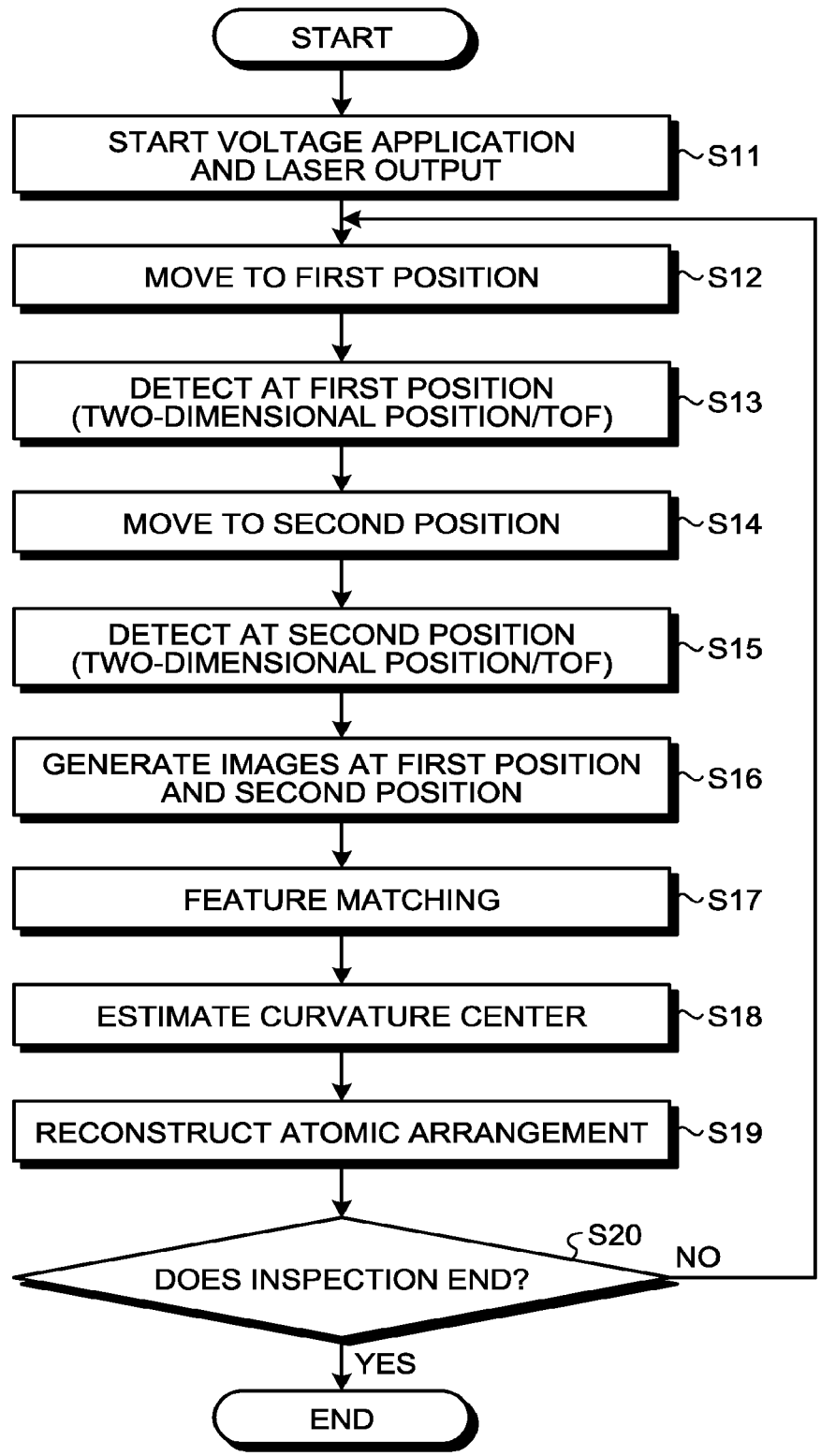
FIG. 11 is a flowchart of an operation of the atom probe inspection device according to the first embodiment.

FIG. 11 is a flowchart of the operation of the atom probe inspection device according to the first embodiment. A flow of the operation of the atom probe inspection device 1 according to this embodiment will be described with reference to FIG. 11.

Step S11

The voltage control unit 211 of the controller 31 causes the high-voltage power supply 32 to start an operation of applying a high voltage to the sample 11. Specifically, the high-voltage power supply 32 starts to apply a voltage according to the control of the voltage control unit 211 to generate an electric field slightly lower than the evaporation electric field of the sample 11. In addition, the laser control unit 212 of the controller 31 causes the laser device 33 to emit a laser to the end of the sample 11. Specifically, the laser device 33 starts to emit a pulse laser to the end of the sample 11 according to the control of the laser control unit 212. Then, the procedure proceeds to Step S12.

Step S12

The position control unit 213 of the controller 31 causes the position drive circuit 34 to move the position sensitive detector 12 toward a given first position (for example, the position pos1 illustrated in FIG. 9) (an example of the first condition). Then, the procedure proceeds to Step S13.

Step S13

The detector 201 of the controller 31 acquires the two-dimensional position information of the ion separated from the sample 11 which is detected by the position sensitive detector 12 at the first position and the TOF of the ion from the sample 11 to the position sensitive detector 12 as the detection information from the detection device 35. Then, the mass analyzer 202 of the controller 31 calculates the ratio m/z between the mass number and the charge number of the ion separated from the sample 11 by the motion equation of the ion in the electric field using the TOF acquired by the detector 201, and performs the mass analysis in which an element of the material of the sample 11 is identified from the ratio m/z. In this case, the detection information acquired by the detector 201 and the information of the element of the ion identified by the mass analyzer 202 may be stored in the memory device 36 by the memory control unit 215. With this configuration, as described below, the information stored in the memory device 36 can be used at the time of the reconstruction process after the information at a second position is acquired. Then, the procedure proceeds to Step S14.

Step S14

The position control unit 213 of the controller 31 causes the position drive circuit 34 to move the position sensitive detector 12 to the second position different from the first position (for example, the position pos2 illustrated in FIG. 9) (an example of the second condition). Then, the procedure proceeds to Step S15.

Step S15

The detector 201 of the controller 31 acquires the two-dimensional position information of the ion separated from the sample 11 which is detected by the position sensitive detector 12 at the second position and the TOF of the ion from the sample 11 to the position sensitive detector 12 as the detection information from the detection device 35. Then, the mass analyzer 202 of the controller 31 calculates the ratio m/z between the mass number and the charge number of the ion separated from the sample 11 by the motion equation of the ion in the electric field using the TOF acquired by the detector 201, and performs the mass analysis in which an element of the material of the sample 11 is identified from the ratio m/z. Then, the procedure proceeds to Step S16.

Step S16

At the first position of the position sensitive detector 12, the image generator 203 of the controller 31 generates or reconstructs an image as a first image representing the distribution of the atoms on the surface of the sample 11, in accordance with the two-dimensional position information of the ion acquired by the detector 201 and the information on the element of the ion identified by the mass analyzer 202. At the second position of the position sensitive detector 12, the image generator 203 generates or reconstructs an image as a second image representing the distribution of the atoms on the surface of the sample 11, in accordance with the two-dimensional position information of the ion acquired by the detector 201 and the information on the element of the ion identified by the mass analyzer 202. Then, the procedure proceeds to Step S17.

Step S17

The matcher 204 of the controller 31 performs the feature matching of two images (the first and second images) generated by the image generator 203. Then, the procedure proceeds to Step S18.

Step S18

The estimator 205 of the controller 31 calculates the distortion amount of corresponding locations in two images on the basis of the result of the feature matching of the two images (the first and second images) by the matcher 204, and calculates the trajectory of the ion using the distortion amount to estimate the center of the curvature circle at the point on the sample 11 from which the ion corresponding to the location has been separated. Then, the procedure proceeds to Step S19.

Step S19

The reconstructor 206 of the controller 31 reconstructs the image representing the distribution (atomic arrangement) of the atoms on the surface of the sample 11 using the two-dimensional position information of the ion acquired by the detector 201, the information of the element of the ion identified by the mass analyzer 202, and the information of the center of the curvature circle of each ion estimated by the estimator 205. The reconstructor 206 arranges the reconstruction images reconstructed with respect to the distribution of the atoms on the surface of the sample 11 chronologically so as to obtain the three-dimensional map representing the three-dimensional distribution of atoms of the sample 11. Then, the procedure proceeds to Step S20.

Step S20

At the time of completing the inspection by the atom probe inspection device 1 (reconstructing the distribution of the atoms of the sample 11) (Yes in Step S20), the atom probe inspection device 1 ends the operation. For continuing the inspection (No in Step S20), the procedure returns to Step S12.

Through Steps S11 to S20, the atom probe inspection device 1 performs the inspection.

As described above, the atom probe inspection device 1 according to this embodiment moves the position sensitive detector 12 to two locations, and detect the two-dimensional position information and the TOF of the ion separated and having flown from the sample 11 at each of the positions. In addition, the atom probe inspection device 1 identifies the element of the ion from the TOF, and generates the reconstruction image of each position from the position information detected at the two positions and the information on the identified element. The atom probe inspection device 1 performs the feature matching of the reconstruction images to calculate amount of distortion of the two reconstruction images at the corresponding locations from the result of the feature matching, and calculate the trajectory of the ion from the distortion amount to estimate the center of the curvature circle at the point on the sample 11 from which the ion corresponding to the location has been separated. Further, the atom probe inspection device 1 uses, for reconstruction, the estimated center of the curvature circle at the point on the sample 11 from which the ion has been separated, to generate a distortion-corrected reconstruction image with no error caused by the local magnification. This enables correction of distortion of the reconstructed image of the positions (distribution) of the atoms of the sample 11, due to the local magnification of the sample 11.

In this embodiment, the position sensitive detector 12 detects the detection information at two locations, but the embodiment is not limited thereto. The position sensitive detector 12 may detect the detection information at three or more locations.

First Modification

An atom probe inspection device according to a first modification of the first embodiment will be described mainly on a difference from the atom probe inspection device 1 according to the first embodiment. The first embodiment has described the example of moving the position of the position sensitive detector 12. This modification will describe an example of moving the position of a reflection lens which returns or reflects the ion separated from the sample 11 by the electric field.

Figure 12:
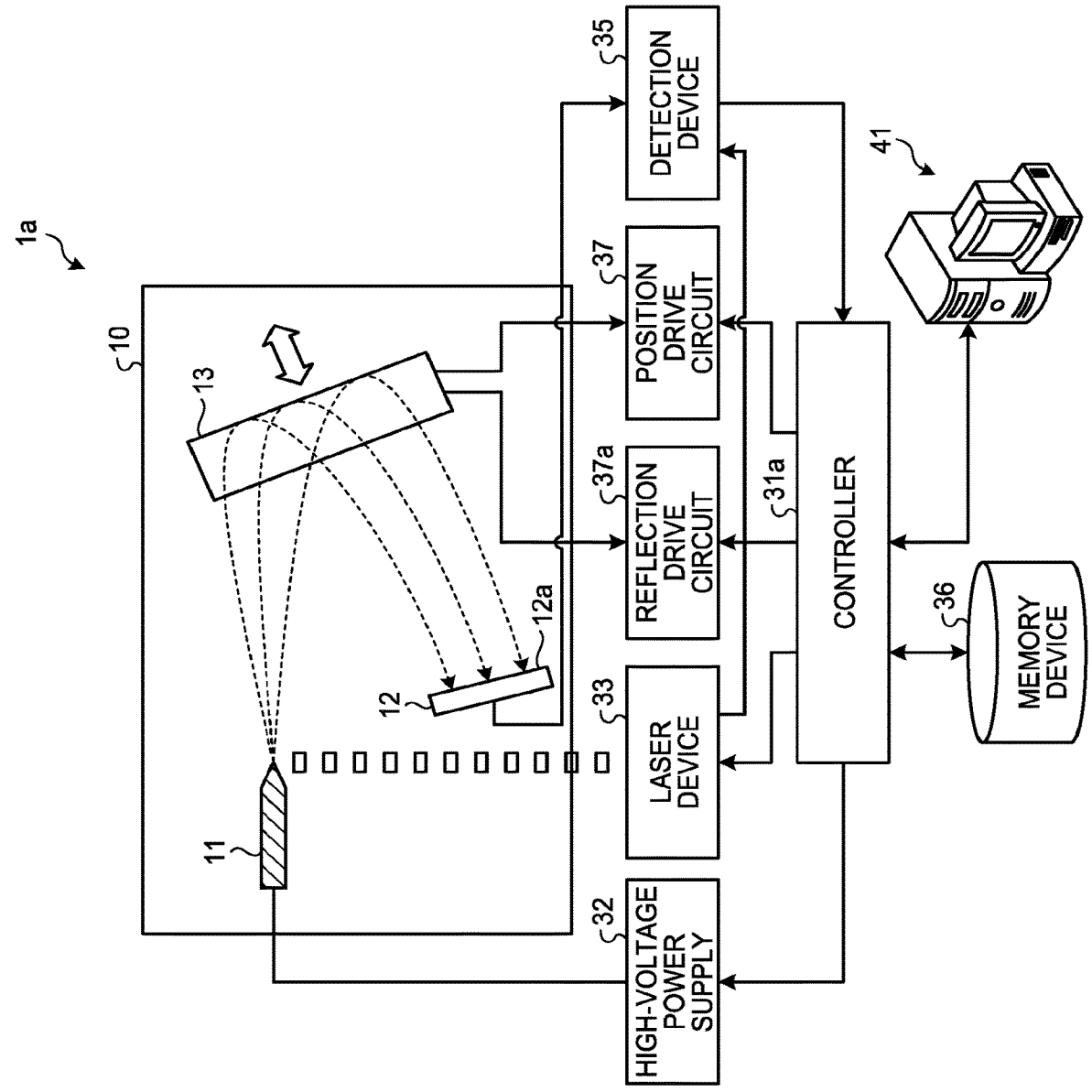
FIG. 12 is a diagram illustrating an exemplary configuration of the atom probe inspection device according to a first modification of the first embodiment.

FIG. 12 is diagram illustrating an exemplary configuration of an atom probe inspection device according to the first modification of the first embodiment. The entire configuration of an atom probe inspection device 1a according to this modification will be described with reference to FIG. 12.

As illustrated in FIG. 12, the atom probe inspection device 1a according to this modification includes the position sensitive detector 12, a reflection lens 13, a controller 31a, the high-voltage power supply 32, the laser device 33, the detection device 35, a position drive circuit 37, a reflection drive circuit 37a, and the memory device 36. Further, the operations of the position sensitive detector 12, the high-voltage power supply 32, the laser device 33, the detection device 35, and the memory device 36 are similar to those of the first embodiment.

The reflection lens 13 is an electrooptical device which forms a given electric field to cause the flying ion to return the trajectory and travel in a different direction. Specifically, the reflection lens 13 returns the trajectory of the flying ion so as to fly in a direction toward the position sensitive detector 12. The reflection lens 13 is, for example, a device corresponding to a reflection mirror of an optical system.

The controller 31a is a controller to control the entire atom probe inspection device 1a. Specifically, the controller 31a controls the operations of the high-voltage power supply 32, the laser device 33, the position drive circuit 37, and the reflection drive circuit 37a, and performs the reconstruction process in which a distribution (positions) of the atoms on the surface of the sample 11 is calculated from the information obtained by the detection device 35 and is represented in image. In addition, the controller 31a arranges the images of the distribution of the atoms on the surface of the sample 11 chronologically so as to obtain a three-dimensional map which indicates the three-dimensional distribution of atoms of the sample 11. Further, a hardware configuration of the controller 31a is similar to that of the controller 31 illustrated in FIG. 3.

The position drive circuit 37 is a drive circuit to move the position of the reflection lens 13 according to the control of the controller 31a. Specifically, the reflection lens 13 is fixed to an actuator which actually moves the position. The actuator drives moves the reflection lens 13 by a drive signal from the position drive circuit 37.

The reflection drive circuit 37a is a drive circuit to apply a current or a voltage to form an electric field by the reflection lens 13.

Figure 13:
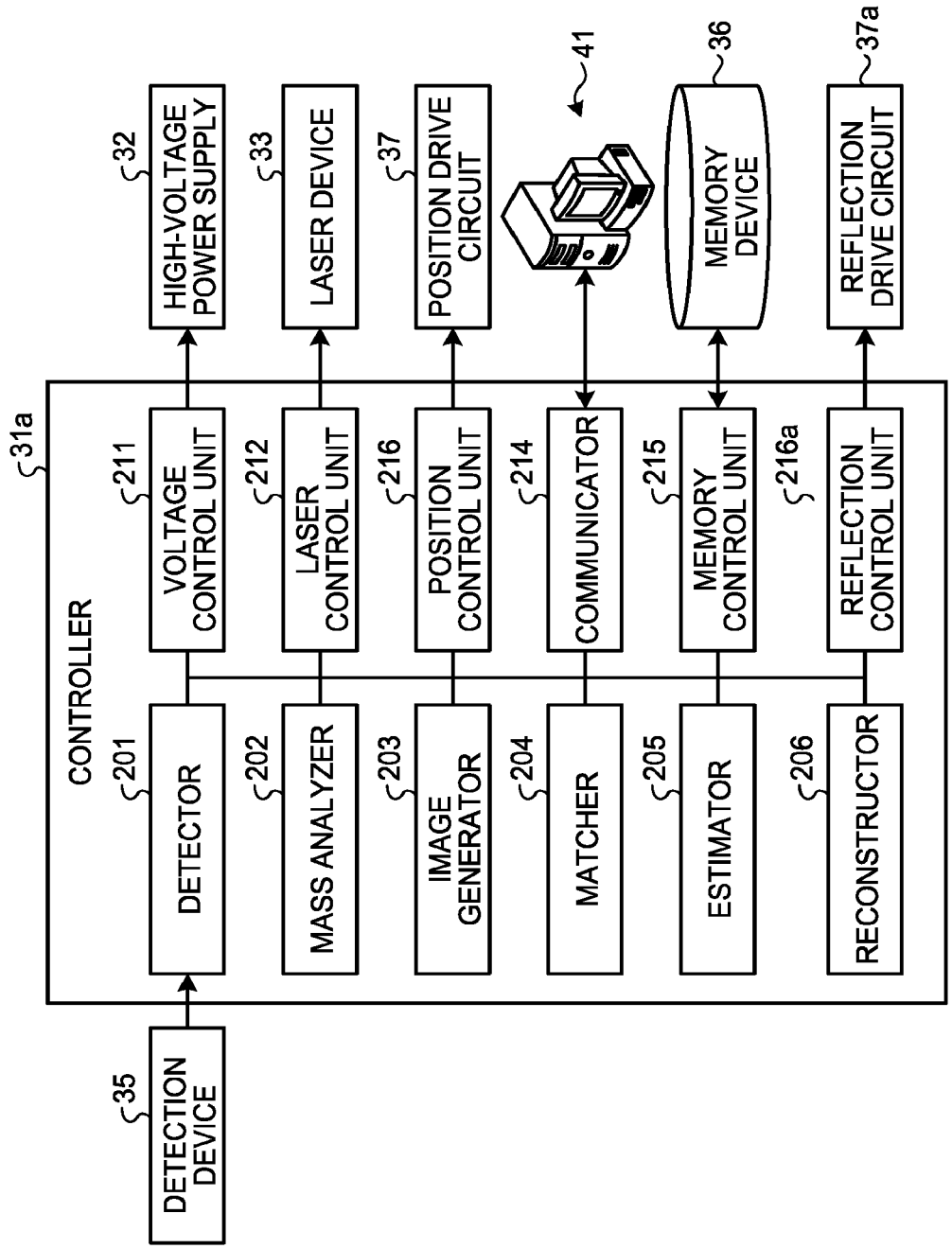
FIG. 13 is a diagram illustrating an exemplary configuration of functional blocks of the controller in the first modification of the first embodiment.

FIG. 13 is a diagram illustrating an exemplary configuration of functional blocks of the controller in the first modification of the first embodiment. The configuration and the operation of the functional blocks of the controller 31a in this modification will be described with reference to FIG. 13.

As illustrated in FIG. 13, the controller 31a according to this modification includes the detector 201, the mass analyzer 202, the image generator 203, the matcher 204, the estimator 205, the reconstructor 206, the voltage control unit 211, the laser control unit 212, the communicator 214, the memory control unit 215, a position control unit 216, and a reflection control unit 216a. Further, the operations of the detector 201, the mass analyzer 202, the image generator 203, the matcher 204, the estimator 205, the reconstructor 206, the voltage control unit 211, the laser control unit 212, the communicator 214, and the memory control unit 215 are similar to those described in FIG. 4. These units represent commands stored in a storage medium to be read by an integrated circuit and/or a computer and executable by the CPU or one or more processors, and part of them may execute the following processing.

The position control unit 216 is a functional unit which controls the operation of the position drive circuit 37 to control the operation of moving the reflection lens 13. The position control unit 216 is implemented by the CPU 101's executing the program illustrated in FIG. 3.

The reflection control unit 216a is a functional unit which controls the operation of the reflection drive circuit 37a to control the forming of the electric field by the reflection lens 13. The reflection control unit 216a is implemented by the CPU 101's executing the program illustrated in FIG. 3.

Further, part or all of the detector 201, the mass analyzer 202, the image generator 203, the matcher 204, the estimator 205, the reconstructor 206, the voltage control unit 211, the laser control unit 212, the position control unit 216, and the reflection control unit 216a may be implemented by hardware circuitry such as FPGA or ASIC instead of a software program.

The functional units of the controller 31*a* illustrated in FIG. 13 are conceptual functions, and are not limited to such a configuration. For example, the plurality of functional units as independent functional units in the controller 31*a* illustrated in FIG. 13 may be one functional unit. The function of one functional unit in the controller 31*a* illustrated in FIG. 13 may be divided into a plurality of functions serving as a plurality of functional units.

Figure 14:
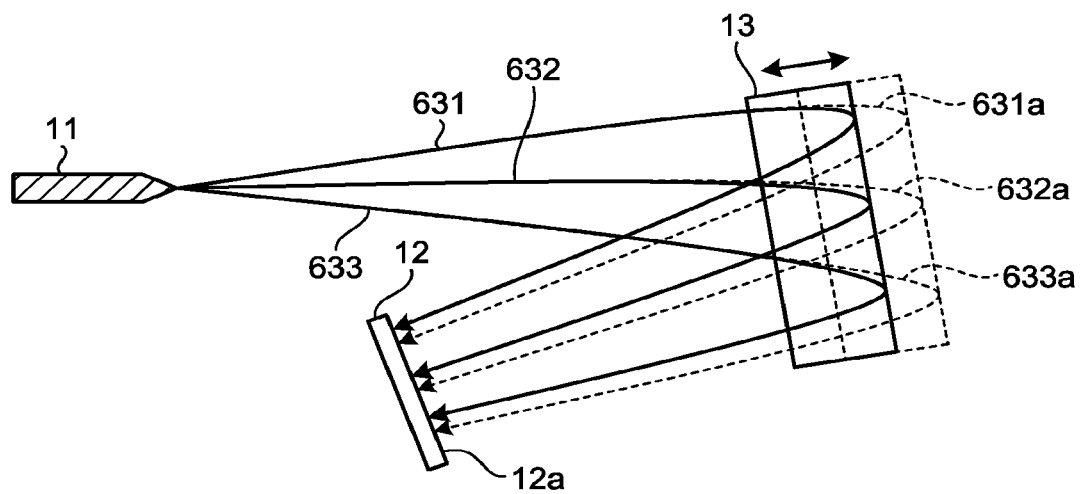
FIG. 14 is a diagram for illustrating moving a reflection lens in the first modification of the first embodiment.

FIG. 14 is a diagram for illustrating the operation of moving the reflection lens in the first modification of the first embodiment. Next, the operation of moving the reflection lens 13 in the atom probe inspection device 1*a* according to this modification will be described with reference to FIG. 14.

As described above, the reflection lens 13 is movable in position by the position drive circuit 37. As illustrated in FIG. 14, while the reflection lens 13 is located at a certain position (an exemplary first condition, first position), for example, the ions separated by the electric field evaporation from the sample 11 along trajectories 631 to 633 are reflected along the trajectories 631 to 633 by the electric field of the reflection lens 13 toward the position sensitive detector 12, and detected by the detection surface 12*a*. In this case, as illustrated in FIG. 9, if the sample 11 has a shape of which the local magnification is different at each position of the surface (different curvature), the ion detected at a certain position of the detection surface 12*a* is estimated as flying from the center of the circle along the spherical crown shape although the ion flies from the point on the curvature circle with the center different from that of the circle along the spherical crown shape. Then, the position on the sample 11 of the atom (the base of the ion) is erroneously reconstructed by the image generator 203 such that the atom is on the circle along the spherical crown shape regardless of that the atom is at the point on the curvature circle. As a result, a reconstruction image containing a distortion is obtained.

Next, while the reflection lens 13 is at a position (in the example of FIG. 14, a position separated from the sample 11 rather than the certain position) (an example of the second condition, the second position) different from the certain position, the ions, separated from the sample 11 by the electric field evaporation along trajectories 631*a* to 633*a*, are reflected by the electric field of the reflection lens 13 along trajectories 631*a* to 633*a* toward the position sensitive detector 12, and detected on the detection surface 12*a*. Also, in this case, the ion detected at a certain position of the detection surface 12*a* is estimated as having flown from the center of the circle of the spherical crown shape although the ion have actually flown from the point on a curvature circle with the center different from that of the circle of the spherical crown shape. Then, the position on the sample 11 of the atom (the base of the ion) is erroneously reconstructed by the image generator 203 such that the atom is on the circle along the spherical crown shape in spite of the atom being at the point on the curvature circle. This results in a reconstruction image containing a distortion different from the one when the reflection lens 13 is at the certain position.

Then, the matcher 204 performs the feature matching of two images obtained as the reconstruction image which contains a distortion different from the original distribution of atoms. With the feature matching, it is possible to associate the positions of the boundaries between both materials of two images. With the feature matching, it is possible to associate the positions of the boundaries of the image portions corresponding to a plurality of materials. Then, on the basis of the result of the feature matching, the estimator 205 calculates the distortion amount (for example, the boundary position of the material) at the corresponding locations in two reconstruction images, and calculates the trajectory of the ion from the distortion amount to estimate the center of the curvature circle at the point on the sample 11 from which the ion corresponding to the location has been separated. Lastly, the reconstructor 206 corrects the distortion by the reconstruction using the center (estimated by the estimator 205) of curvature circle at the point on the sample 11 from which the ion has been separated, so that the reconstruction image having no error caused by the local magnification is obtained.

As described above, the trajectory of the ion is changed by moving the position of the reflection lens 13 instead of the position of the position sensitive detector 12, so that it is possible to detect the ion separated from the same position on the sample 11 at a different position in the detection surface 12*a*. With this configuration, two reconstruction images along with the distortion can be obtained, and the corresponding locations can be identified by the feature matching. Then, the distortion amount of the corresponding locations is calculated. The trajectory of the ion is calculated from the distortion amount. Thus, the center of the curvature circle at the point on the sample 11 from which the ion corresponding to the location has been separated is estimated. The distortion is corrected by the reconstruction using the estimated center of the curvature circle at the point on the sample 11 from which the ion has been separated. Thus, the reconstruction image having no error caused by the local magnification is obtained. Thereby, it is possible to correct the distortion, caused by the local magnification of the sample 11, of the image reconstructed at the position (distribution) of the atom of the sample 11.

In this modification, the reflection lens 13 uses the detection information each detected at two positions by the position sensitive detector 12, but the invention is not limited thereto. The reflection lens 13 may use the detection information at three or more positions detected by the position sensitive detector 12.

In addition, by changing the trajectory of the ion by changing the position of the reflection lens 13, the trajectory of the ion may be deviated from the detection surface 12*a* of the position sensitive detector 12, lowering the yield. Thus, it is desirable to use means for correcting this defect in combination with the reflection lens 13. Examples of such means include a mechanism for slightly inclining the reflection surface of the reflection lens 13 while moving the position of the reflection lens 13, moving the position of the position sensitive detector 12 in conjunction with the movement of the reflection lens 13, use of the position sensitive detector 12 including a wider detection surface 12*a*, or an optical element such as an electrostatic lens or an electromagnetic lens to bend the trajectory further ahead of the detection surface 12*a*.

Second Modification

A second modification of the first embodiment will be described mainly on a difference from the first embodiment. In the atom probe inspection device 1 according to the first embodiment, the ion separated by the electric field evaporation from the sample 11 made of a plurality of materials is detected to detect the ion so as to obtain two labeled reconstruction images, the portions are associated by the feature matching, and the distortion amount is calculated. In other words, the atom probe inspection device 1 has a function of identifying the element of each material of the sample 11 by the mass analysis using the detected TOF. In this modification, the description will be given about the operation of obtaining the reconstruction image in the case of the FIM (field ion microscope) having no function of the mass analysis using the TOF of the atom probe inspection device 1.

Figure 15:
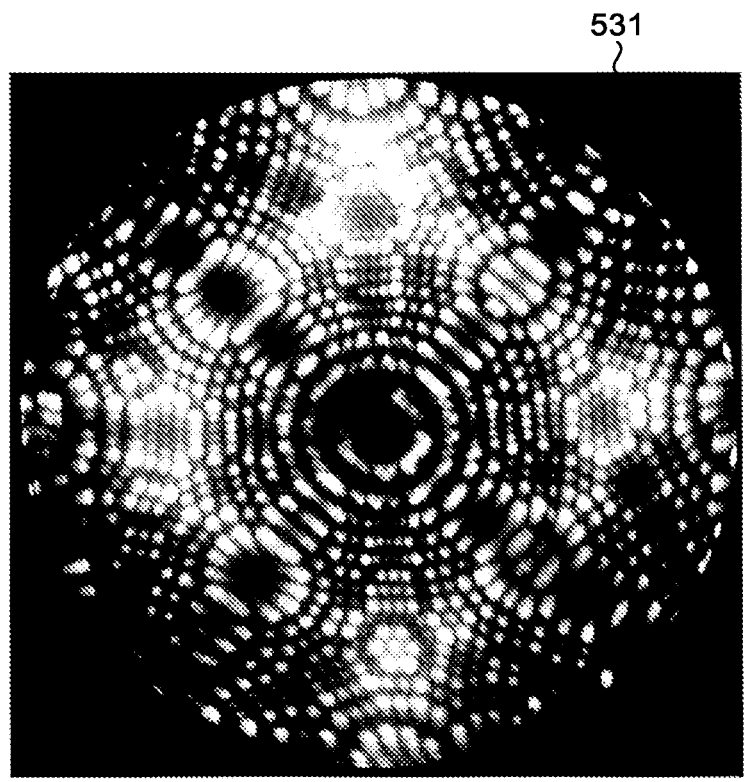
FIG. 15 is a diagram illustrating an exemplary image obtained by an FIM.

FIG. 15 is a diagram illustrating an example of the image obtained by the FIM. With no certain function of the element of the mass analysis, the FIM according to this modification is a device which uses the position sensitive detector 12 to detect a two-dimensional position of the ion separated from the end of the sample by the electric field evaporation from the sample made of a single material for example, and reconstructs the distribution of the atoms on the surface of the sample. Thus, the configuration of the functional blocks of the controller of the FIM according to this modification may be configured excluding the mass analyzer 202 among the functional blocks of the controller 31 of the atom probe inspection device 1 illustrated in FIG. 4 for example.

FIG. 15 illustrates an example of the reconstruction imager (FIM image) of the surface of the sample made of a single material obtained by such an FIM. As with an FIM image 531 illustrated in FIG. 15, the reconstruction image generated by the FIM is an image including a pattern of a crystal structure of the atoms of the sample.

However, as described in the above embodiment, in the case of the sample having the end of not a spherical crown shape but a shape with a different local magnification at each position on the surface due to various factors, a reconstructed image of the sample contains a distortion, and does not reflect the original distribution of the atoms. In this case, similarly to the embodiment or the first modification, two reconstruction images containing a distortion are generated for feature matching. As illustrated in FIG. 15, for the sample made of a single material, the locations of two images can be associated with each other by feature matching based on the pattern contained in the FIM image. Then, the estimator 205 calculates the distortion amount of the corresponding locations in the two reconstruction images on the basis of the result of the feature matching, and calculates the trajectory of the ion from the distortion amount, to estimate the center of the curvature circle at the point on the sample from which the ion corresponding to the location has been separated. Lastly, the reconstructor 206 corrects the distortion by reconstruction using the center (estimated by the estimator 205) of curvature circle at the point on the sample from which the ion has been separated, to be able to obtain the reconstruction image having no error caused by the local magnification. This makes it possible to correct the distortion, due to the local magnification of the sample, in the reconstructed image of the positions (distribution) of the atoms of the sample made of a single material.

Second Embodiment

An atom probe inspection device according to a second embodiment will be described mainly on a difference from the atom probe inspection device 1 according to the first embodiment. In the first embodiment, the description will be given about a configuration that two reconstruction images are obtained by moving the position of the position sensitive detector 12 by the position drive circuit 34. In this embodiment, the description will be given about that the position of the position sensitive detector 12 is fixed, and the trajectory of the ion is changed by the operation of the electromagnetic lens to obtain two different reconstruction images.

Figure 16:
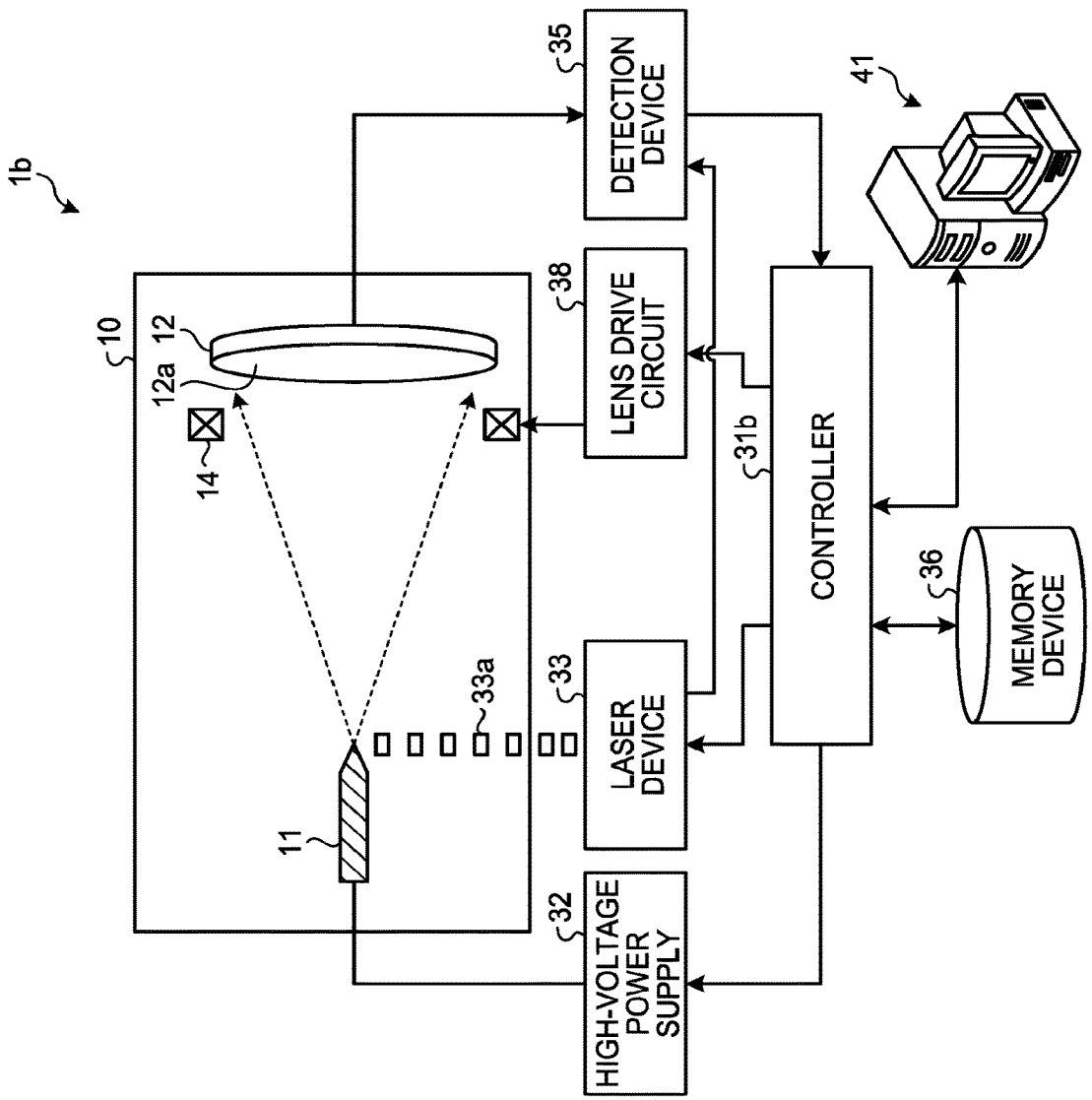
FIG. 16 is a diagram illustrating an exemplary configuration of the atom probe inspection device according to a second embodiment.

FIG. 16 is a diagram illustrating an exemplary configuration of the atom probe inspection device according to the second embodiment. The entire configuration of an atom probe inspection device 1b according to this embodiment will be described with reference to FIG. 16.

As illustrated in FIG. 16, the atom probe inspection device 1b according to this embodiment includes the position sensitive detector 12, an electromagnetic lens 14, a controller 31b, the high-voltage power supply 32, the laser device 33, the detection device 35, a lens drive circuit 38, and the memory device 36. Further, the operations of the position sensitive detector 12, the high-voltage power supply 32, the laser device 33, the detection device 35, and the memory device 36 are similar to those of the first embodiment.

The electromagnetic lens 14 is an electrooptical device which causes a current to flow to a donut-like coil to form a magnetic field, and changes the ion passing through the coil to converge. The electromagnetic lens 14 is, for example, a convex lens of the optical system.

The controller 31b is a controller to control the entire atom probe inspection device 1b. Specifically, the controller 31b controls the operations of the high-voltage power supply 32, the laser device 33, the detection device 35, and the lens drive circuit 38, and performs the reconstruction process in which the distribution (positions) of the atoms on the surface of the sample 11 is calculated from the information obtained by the detection device 35 to be represented in image. In addition, the controller 31b arranges the images of the distribution of the atoms on the surface of the sample 11 chronologically so as to obtain a three-dimensional map which indicates the three-dimensional distribution of atoms of the sample 11. Further, a hardware configuration of the controller 31b is similar to that of the controller 31 illustrated in FIG. 3.

The lens drive circuit 38 is a drive circuit to apply a current of a voltage to form a magnetic field by the electromagnetic lens 14.

Figure 17:
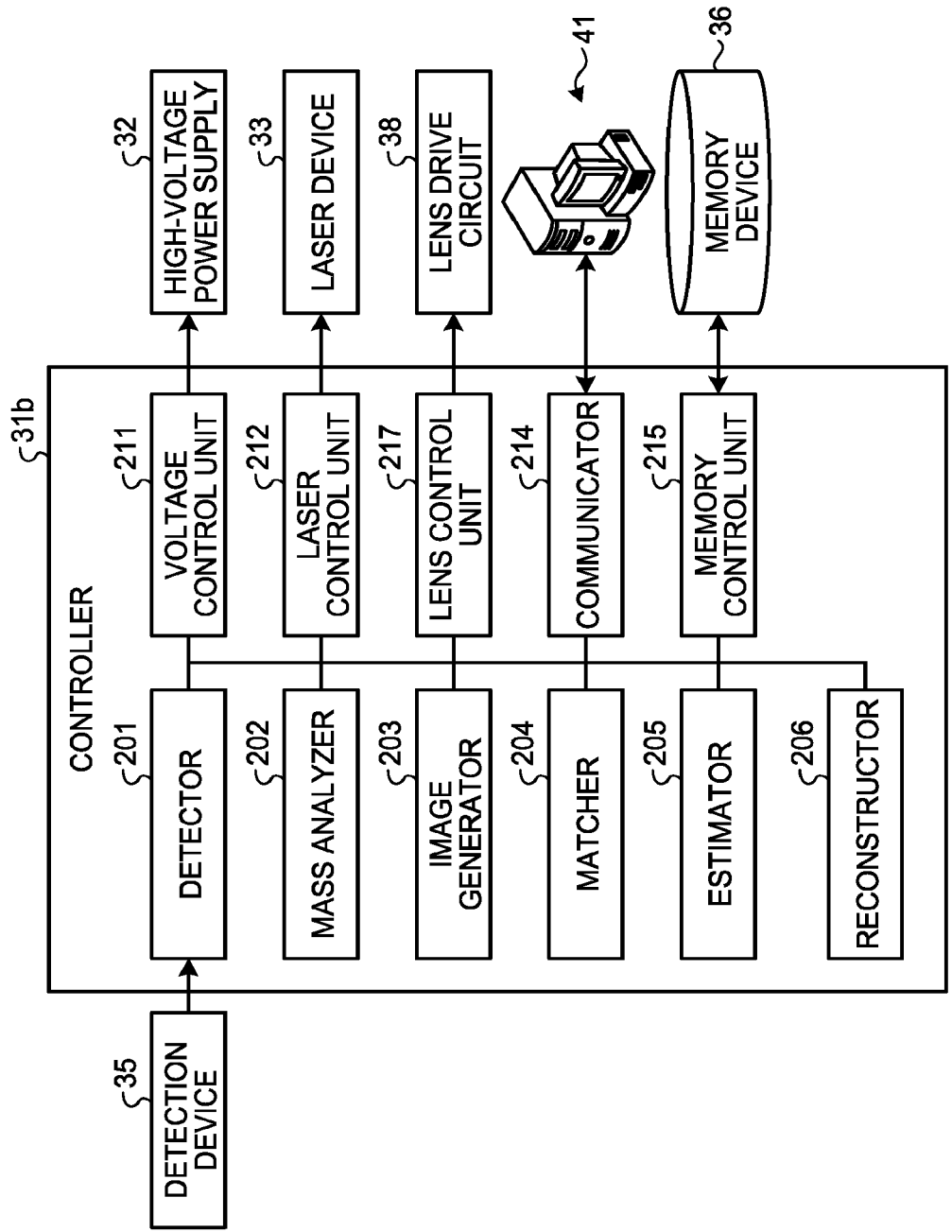
FIG. 17 is a diagram illustrating an exemplary configuration of functional blocks of the controller in the second embodiment.

FIG. 17 is a diagram illustrating an exemplary configuration of functional blocks of the controller in the second embodiment. The configuration and the operation of the functional blocks of the controller 31b according to this embodiment will be described with reference to FIG. 17.

As illustrated in FIG. 17, the controller 31b according to this embodiment includes the detector 201, the mass analyzer 202, the image generator 203, the matcher 204, the estimator 205, the reconstructor 206, the voltage control unit 211, the laser control unit 212, the communicator 214, the memory control unit 215, and a lens control unit 217. Further, the operations of the detector 201, the mass analyzer 202, the image generator 203, the matcher 204, the estimator 205, the reconstructor 206, the voltage control unit 211, the laser control unit 212, the communicator 214, and the memory control unit 215 are similar to those described in FIG. 4. These units represent commands stored in a storage medium to be read by an integrated circuit and/or a computer and executable by the CPU or one or more processors, and part of them may execute the following processing.

The lens control unit 217 is a functional unit which controls the generation of the magnetic field of the electromagnetic lens 14 by controlling the operation of the lens drive circuit 38. The lens control unit 217 is implemented by the CPU 101's executing the program illustrated in FIG. 3.

Further, part or all of the detector 201, the mass analyzer 202, the image generator 203, the matcher 204, the estimator 205, the reconstructor 206, the voltage control unit 211, the laser control unit 212, and the lens control unit 217 may be implemented by hardware circuitry such as FPGA or ASIC instead of a software program.

In addition, the functional units of the controller 31b illustrated in FIG. 17 are conceptual functions, and are not limited to such a configuration. For example, the functional units as independent functional units in the controller 31b illustrated in FIG. 17 may be one functional unit. Alternatively, the function of one functional unit in the controller 31b illustrated in FIG. 17 may be divided into a plurality of functions serving as a plurality of functional units.

Figure 18:
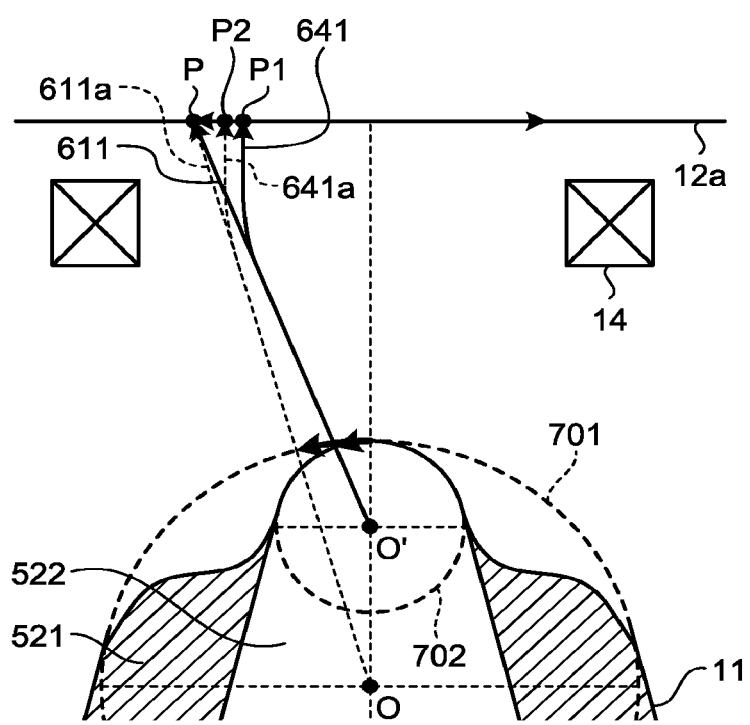
FIG. 18 is a diagram for illustrating an operation of changing a trajectory by an electromagnetic lens in the second embodiment.

FIG. 18 is a diagram for illustrating an operation of changing the trajectory by the electromagnetic lens in the second embodiment. Next, the description will be given about the operation of changing the trajectory of the ion by the electromagnetic lens 14 in the atom probe inspection device 1b according to this embodiment with reference to FIG. 18. Further, the shape of the sample 11 illustrated in FIG. 18 is similar to that of the sample 11 illustrated in FIG. 8.

First, the description will be given about an example that no current flowing the coil of the electromagnetic lens 14 and the magnetic field is generated (an example of the first condition). In this case, the trajectory of the ion detected at point P on the detection surface 12a of the position sensitive detector 12 is a trajectory 611 passing point O' which is the center of a circle 702 which is the curvature circle at a location where the atom (the base of the ion) is located. However, the trajectory is estimated as a trajectory 611a passing point O which is the center of the circle 701 along the spherical crown shape. Then, the position on the sample 11 of the atom (the base of the ion) is erroneously reconstructed as being on point Q' although the location is originally point Q. As a result, the image of the material 522 reconstructed larger than the original size (that is, the reconstruction image containing distortion; for example, the image 801 illustrated in (b)) of FIG. 10 is obtained.

The following will describe an example that under the control of the lens control unit 217, the lens drive circuit 38 applies current to the coil of the electromagnetic lens 14 to generate a magnetic field (an exemplary second condition). In this case, the ion, having flown toward the electromagnetic lens 14 along the trajectory 611, reaches a position under the influence of the magnetic field of the electromagnetic lens 14 and is bent by the convergence of the electromagnetic lens 14 to fly on a trajectory 641, and reaches point P1 on the detection surface 12a. Meanwhile, the ion, having flown along the trajectory 611a, is bent by the convergence of the electromagnetic lens 14 to fly on a trajectory 641a, and reaches point P2 on the detection surface 12a. Thus, in the magnetic field of the electromagnetic lens 14, the reconstructed image based on the two-dimensional position information of the ion detected by the position sensitive detector 12 contains distortion as compared with the reconstructed image of the sample 11 of a spherical crown shape.

Then, the matcher 204 performs the feature matching of two images obtained as the reconstruction image which contains a distortion different from the original distribution of atoms. With the feature matching, it is possible to associate the positions of the boundaries between both materials of two images. With the feature matching, it is possible to associate the positions of the boundaries of the image portions corresponding to a plurality of materials. Then, on the basis of the result of the feature matching, the estimator 205 calculates the distortion amount (for example, the boundary position of the material) of the corresponding locations in two reconstruction images, and calculates the trajectory of the ion from the distortion amount to estimate the center of the curvature circle at the point on the sample 11 from which the ion corresponding to the location has been separated. Lastly, the reconstructor 206 corrects the distortion by the reconstruction using the center (estimated by the estimator 205) of curvature circle at the point on the sample 11 from which the ion has been separated, so that the reconstruction image having no error caused by the local magnification is obtained.

As described above, the magnetic field is generated by the electromagnetic lens 14 instead of the position of the position sensitive detector 12, so that it is possible to detect the ion separated from the same position on the sample 11 at a different position in the detection surface 12a. With this configuration, two reconstruction images including the distortion can be generated to be able to identify the corresponding locations by the feature matching. Then, the distortion amount of the corresponding locations is calculated to calculate the trajectory of the ion from the distortion amount. Thus, the center of the curvature circle at the point on the sample 11 from which the ion corresponding to the location has been separated is estimated. The distortion is corrected by the reconstruction using the estimated center of the curvature circle at the point on the sample 11 from which the ion has been separated. Thus, the reconstruction image having no error caused by the local magnification is obtained. With this configuration, it is possible to correct the distortion, caused by the local magnification of the sample 11, in the image reconstructed at the position (distribution) of the atom of the sample 11.

In addition, the position sensitive detector 12 does not need to be moved in the vacuum chamber 10 unlike in the first embodiment, which leads to reducing the occurrence of dust and saving the space for the moving region of the position sensitive detector 12 compared with the first embodiment.

Generally, the electromagnetic lens 14 has hysteresis in terms of the relation between the magnitude and the magnetic flux density of the magnetic field. Thus, the voltage or the current to be applied to the electromagnetic lens 14 is desirably a periodic signal such as a sinusoidal wave.

In this embodiment, the detection information acquired in no magnetic field and in the magnetic field of the electromagnetic lens 14 are used, but the embodiment is not limited thereto. The magnetic field may be set at two kinds of intensity (the first condition and the second condition), and the detection information acquired in each magnetic field may be used. In addition, the detection information used for the reconstruction is not limited to two types, but the detection information obtained in three or more intensities of the magnetic field may be used.

First Modification

An atom probe inspection device according to a first modification of the second embodiment will be described mainly on a difference from the atom probe inspection device 1b according to the second embodiment. In the second embodiment, the description will be given about a configuration in which the trajectory of the ion is changed by the electromagnetic lens 14 installed near the position sensitive detector 12. This modification will describe an example of changing the trajectory of the ion by a condenser lens located near the sample 11.

Figure 19:
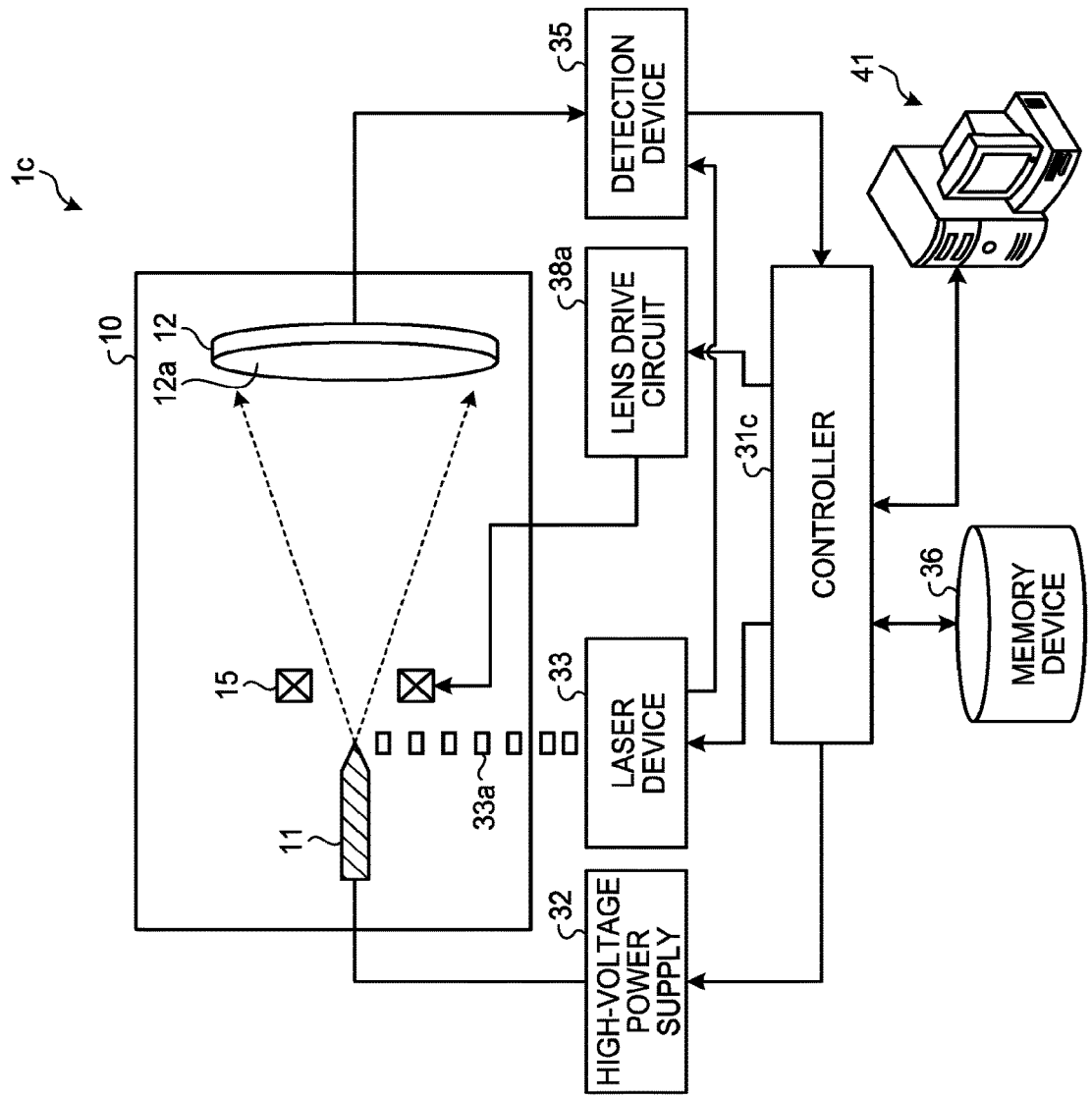
FIG. 19 is a diagram illustrating an exemplary configuration of the atom probe inspection device according to the first modification of the second embodiment.

FIG. 19 is a diagram illustrating an exemplary configuration of the atom probe inspection device according to the first modification of the second embodiment. The entire configuration of an atom probe inspection device 1c according to this modification will be described with reference to FIG. 19.

As illustrated in FIG. 19, the atom probe inspection device 1c according to this modification includes the position sensitive detector 12, a condenser lens 15, a controller 31c, the high-voltage power supply 32, the laser device 33, the detection device 35, a lens drive circuit 38a, and the memory device 36. The operations of the position sensitive detector 12, the high-voltage power supply 32, the laser device 33, the detection device 35, and the memory device 36 are similar to those of the second embodiment.

The condenser lens 15 is an electrooptical device which allows the trajectory of the ion separated from the sample 11 to converge. The condenser lens 15 is, for example, an electromagnetic lens that generates an electromagnetic field by causing a current to flow to a donut-like coil.

The controller 31c is a controller to control the entire atom probe inspection device 1c. Specifically, the controller 31c controls the operations of the high-voltage power supply 32, the laser device 33, the detection device 35, and the lens drive circuit 38a, and performs a reconstruction process in which a distribution (positions) of atoms on the surface of the sample 11 is calculated from the information obtained by the detection device 35 to be represented in image. In addition, the controller 31c arranges the images of the distribution of the atoms on the surface of the sample 11 chronologically so as to obtain a three-dimensional map which indicates the three-dimensional distribution of atoms of the sample 11. Further, a hardware configuration of the controller 31c is similar to that of the controller 31 illustrated in FIG. 3.

In addition, the configuration of the functional blocks of the controller 31c is similar to that of the controller 31b illustrated in FIG. 17. Among them, the lens control unit 217 may control the operation of the lens drive circuit 38a in this modification instead of the lens drive circuit 38, and control the generation of the magnetic field of the condenser lens 15.

In the configuration of the atom probe inspection device 1c as described above, the condenser lens 15 is used instead of the electromagnetic lens 14 of the atom probe inspection device 1b to change the trajectory of the ion. In this way, it is possible to detect the ion separated from the same position on the sample 11 at a different position of the detection surface 12a by causing the condenser lens 15 to form the magnetic field. With this configuration, two reconstruction images along with the distortion can be obtained, and the corresponding locations can be identified by the feature matching. Then, the distortion amount at the corresponding locations is calculated. The trajectory of the ion is calculated from the distortion amount. Thus, the center of the curvature circle at the point on the sample 11 from which the ion corresponding to the location has been separated is estimated. The distortion is corrected by the reconstruction using the estimated center of the curvature circle at the point on the sample 11 from which the ion has been separated. Thus, the reconstruction image having no error caused by the local magnification is generated. Thereby, it is possible to correct the distortion, caused by the local magnification of the sample 11, in the image reconstructed at the position (distribution) of the atom of the sample 11.

Second Modification

An atom probe inspection device according to a second modification of the second embodiment will be described, mainly on a difference from the atom probe inspection device 1b according to the second embodiment. In the second embodiment, the description will be given about a configuration in which the trajectory of the ion is changed by forming a magnetic field by the electromagnetic lens 14. In this modification, the description will be given about a configuration in which the trajectory of the ion is changed by forming an electric field in the middle of the trajectory of the ion.

Figure 20:
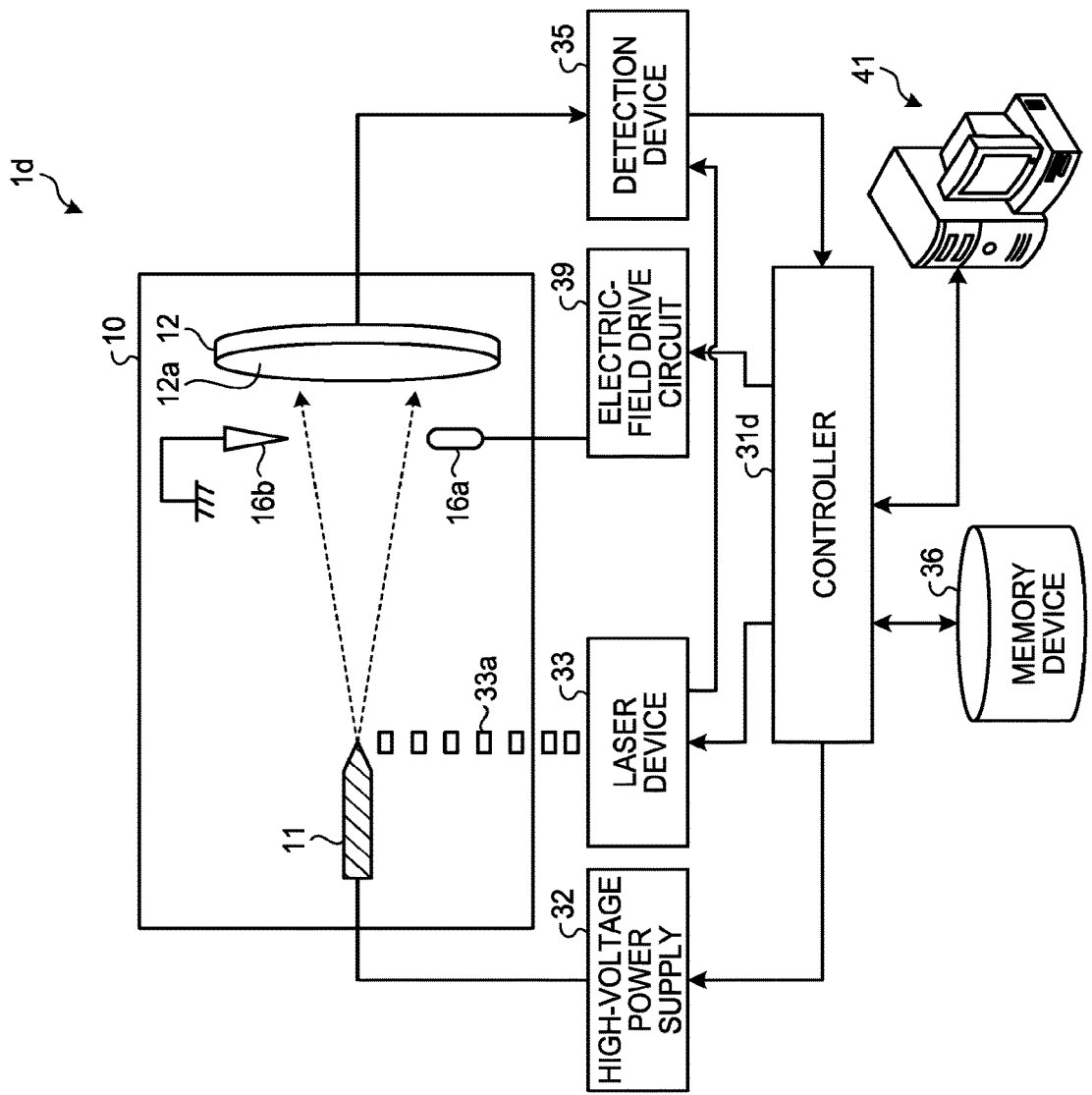
FIG. 20 is a diagram illustrating an exemplary configuration of the atom probe inspection device according to a second modification of the second embodiment.

FIG. 20 is a diagram illustrating an exemplary configuration of the atom probe inspection device according to the second modification of the second embodiment. The entire configuration of an atom probe inspection device 1d according to this modification will be described with reference to FIG. 20.

As illustrated in FIG. 20, the atom probe inspection device 1d according to this modification includes the position sensitive detector 12, an anode 16a, a cathode 16b, a controller 31d, the high-voltage power supply 32, the laser device 33, the detection device 35, an electric-field drive circuit 39, and the memory device 36. Further, the operations of the position sensitive detector 12, the high-voltage power supply 32, the laser device 33, the detection device 35, and the memory device 36 are similar to those of the second embodiment.

The anode 16a and the cathode 16b are electrodes to form the electric field to change the trajectory of the ion flying from the sample 11 to the position sensitive detector 12. The anode 16a is an electrode to form the electric field, and the cathode 16b is a negative electrode and is earthed to the ground. The operation of the electric field generated by the anode 16a and the cathode 16b corresponds to a prism of the optical system for example.

The controller 31d is a controller to control the entire atom probe inspection device 1d. Specifically, the controller 31d controls the operations of the high-voltage power supply 32, the laser device 33, and the electric-field drive circuit 39, performs a reconstruction process in which a distribution (positions) of atoms on the surface of the sample 11 is calculated from the information obtained by the detection device 35 to be represented in image. In addition, the controller 31d arranges the images of the distribution of the atoms on the surface of the sample 11 chronologically so as to obtain a three-dimensional map which indicates the three-dimensional distribution of atoms of the sample 11. Further, a hardware configuration of the controller 31d is similar to that of the controller 31 illustrated in FIG. 3.

The electric-field drive circuit 39 is a drive circuit to apply a voltage to the anode 16a to form the electric field between the anode 16a and the cathode 16b according to the control of the controller 31d.

Figure 21:
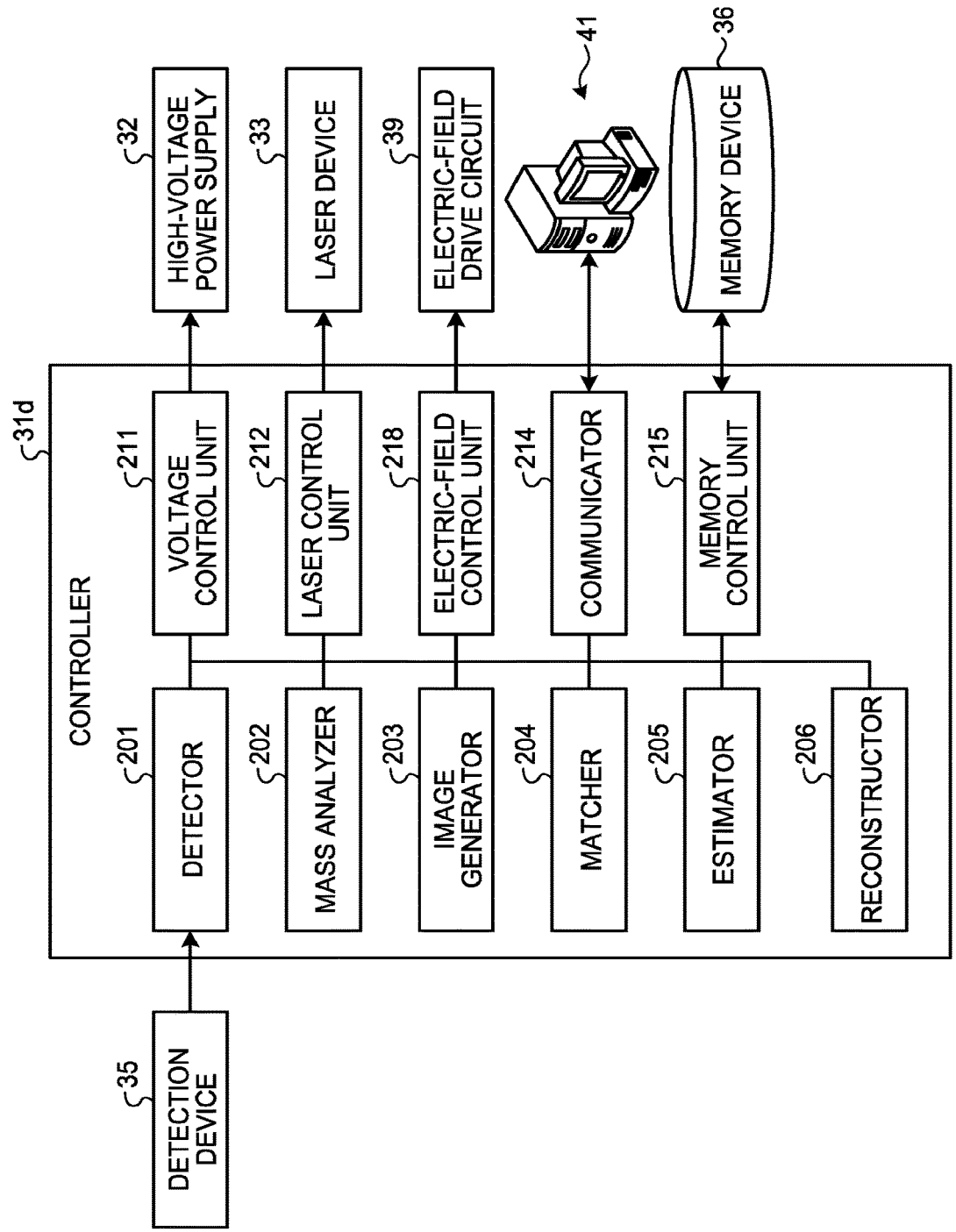
FIG. 21 is a diagram illustrating an exemplary configuration of functional blocks of the controller in the second modification of the second embodiment.

FIG. 21 is a diagram illustrating an exemplary configuration of functional blocks of the controller in the second modification of the second embodiment. The configuration and the operation of the functional blocks of the controller 31d in this modification will be described with reference to FIG. 21.

As illustrated in FIG. 21, the controller 31d according to this modification includes the detector 201, the mass analyzer 202, the image generator 203, the matcher 204, the estimator 205, the reconstructor 206, the voltage control unit 211, the laser control unit 212, the communicator 214, the memory control unit 215, and an electric-field control unit 218. Further, the operations of the detector 201, the mass analyzer 202, the image generator 203, the matcher 204, the estimator 205, the reconstructor 206, the voltage control unit 211, the laser control unit 212, the communicator 214, and the memory control unit 215 are similar to those described in FIG. 4. These units represent commands stored in a storage medium to be read by an integrated circuit and/or a computer and executable by the CPU or one or more processors, and part of them may execute the following processing.

The electric-field control unit 218 is a functional unit which controls the operation of the electric-field drive circuit 39 to control the generation of the electric field of the anode 16a and the cathode 16b. The electric-field control unit 218 is implemented by the CPU 101's executing the program illustrated in FIG. 3.

Further, part or all of the detector 201, the mass analyzer 202, the image generator 203, the matcher 204, the estimator 205, the reconstructor 206, the voltage control unit 211, the laser control unit 212, and the electric-field control unit 218 may be implemented by hardware circuitry such as FPGA or ASIC instead of a software program.

The functional units of the controller 31d illustrated in FIG. 21 are conceptual functions, and are not limited to such a configuration. For example, the functional units as independent functional units in the controller 31d illustrated in FIG. 21 may be one functional unit. The function of one functional unit in the controller 31d illustrated in FIG. 21 may be divided into functions serving as a plurality of functional units.

Figure 22:
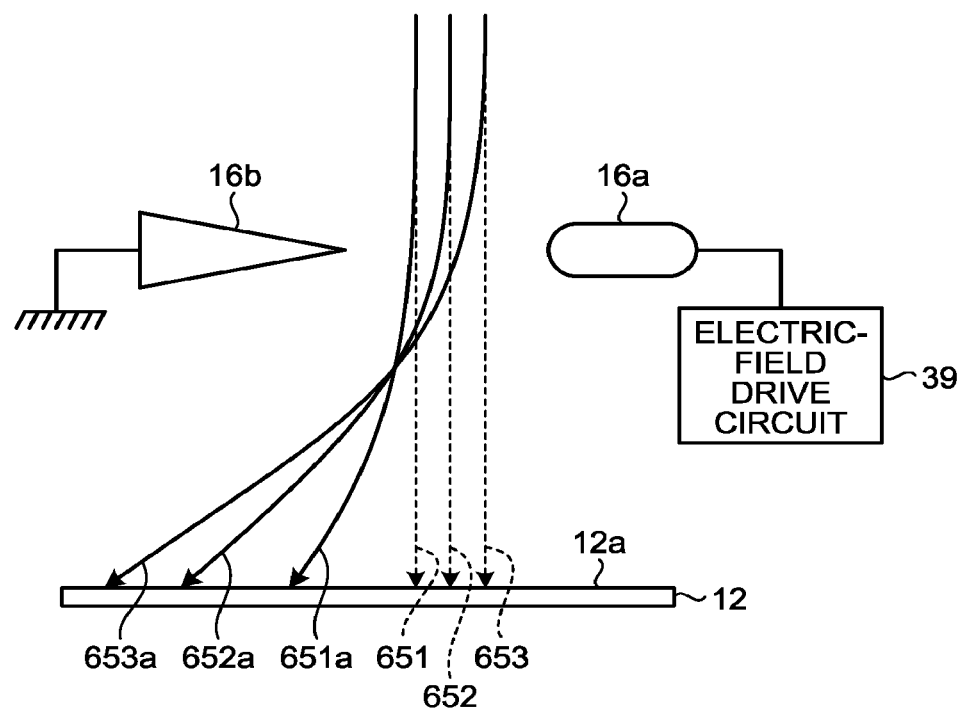
FIG. 22 is a diagram for illustrating an operation of changing a trajectory by an electric field in the second modification of the second embodiment.

FIG. 22 is a diagram for illustrating an operation of changing the trajectory in the electric field of the second modification of the second embodiment. The description will be given about the operation of changing the trajectory by the electric field in the atom probe inspection device 1d according to this modification with reference to FIG. 22.

First, the description will be given about an example that no electric field is formed between the anode 16a and the cathode 16b (an example of the first condition). In this case, as illustrated in FIG. 22, the ion separated by the electric field evaporation from the sample 11 flies, for example, along trajectories 651 to 653 (that is, straightly without any influence from the electric field) toward the position sensitive detector 12, and detected by the detection surface 12a. In this case, as illustrated in FIG. 9, if the sample 11 has a shape of which the local magnification is different at each position of the surface (different curvature), the ion detected at a certain position of the detection surface 12a is estimated as flying from the center of the circle along the spherical crown shape although the ion flies from the point on the curvature circle with the center different from that of the circle along the spherical crown shape. Then, the position on the sample 11 of the atom (the base of the ion) is erroneously reconstructed by the image generator 203 such that the atom is on the circle along the spherical crown shape regardless of that the atom is at the point on the curvature circle. As a result, a reconstruction image containing a distortion is obtained.

Next, the description will be given about an example that the electric field between the anode 16a and the cathode 16b is formed (an example of the second condition). In this case, as illustrated in FIG. 22, the ion separated by the electric field evaporation from the sample 11 flies along the trajectory bent by the electric field (for example, trajectories 651a to 653a) toward the position sensitive detector 12, and detected by the detection surface 12a. Similarly even in this case, the ion detected at a certain position of the detection surface 12a is estimated as flying from the center of the circle along the spherical crown shape although the ion flies from the point on the curvature circle with the center different from that of the circle along the spherical crown shape. Then, the position on the sample 11 of the atom (the base of the ion) is erroneously reconstructed by the image generator 203 such that the atom is on the circle along the spherical crown shape regardless of that the atom is at the point on the curvature circle. As a result, a reconstruction image containing a distortion different from the one with no electric field between the anode 16a and the cathode 16b is obtained.

Then, the matcher 204 performs the feature matching of two images obtained as the reconstruction image which contains a distortion different from the original distribution of atoms. With the feature matching, it is possible to associate the positions of the boundaries between both materials of two images. With the feature matching, it is possible to associate the positions of the boundaries of the image portions corresponding to a plurality of materials. Then, on the basis of the result of the feature matching, the estimator 205 calculates the distortion amount (for example, the boundary position of the material) of the corresponding locations in two reconstruction images, and calculates the trajectory of the ion from the distortion amount to estimate the center of the curvature circle at the point on the sample 11 from which the ion corresponding to the location has been separated. Lastly, the reconstructor 206 corrects the distortion by performing the reconstruction using the center (estimated by the estimator 205) of curvature circle at the point on the sample 11 from which the ion has been separated, so that the reconstruction image having no error caused by the local magnification is obtained.

As described above, the electric field is generated by the anode 16a and the cathode 16b instead of the magnetic field by the electromagnetic lens 14, so that it is possible to detect the ion separated from the same position on the sample 11 at a different position in the detection surface 12a. With this configuration, two reconstruction images along with the distortion can be obtained, and the corresponding locations can be identified by the feature matching. Then, the distortion amount of the corresponding locations is calculated. The trajectory of the ion is calculated from the distortion amount. Thus, the center of the curvature circle at the point on the sample 11 from which the ion corresponding to the location has been separated is estimated. The distortion is corrected by the reconstruction using the estimated center of the curvature circle at the point on the sample 11 from which the ion has been separated. Thus, the reconstruction image having no error caused by the local magnification is generated. Thereby, it is possible to correct the distortion, caused by the local magnification of the sample 11, in the image reconstructed at the position (distribution) of the atom of the sample 11.

In addition, since the position sensitive detector 12 is not necessarily moved in the vacuum chamber 10 as described in the first embodiment, compared with the first embodiment, it is possible to reduce the risk of causing dust. Further, it is possible to save space for the moving region of the position sensitive detector 12.

In this modification, the detection information obtained in no electric field and in the electric field of the anode 16a and the cathode 16b are used, but the modification is not limited thereto. As two types (the first condition and the second condition) of strength of the electric field to be formed, the detection information obtained in each electric field may be used. In addition, the detection information used in the reconstruction is not limited to the two types, but the detection information obtained in three or more types of states of the electric field may be used.

Third Modification

An atom probe inspection device according to a third modification of the second embodiment will be described mainly on a difference from the atom probe inspection device 1b according to the second embodiment. In the second embodiment, the description will be given about a configuration in which the trajectory of the ion is changed by forming a magnetic field by the electromagnetic lens 14. In this modification, the description will be given about a configuration in which the ion separated from the sample 11 is turned (reflected) back by the operation of the electric field of the reflection lens.

Figure 23:
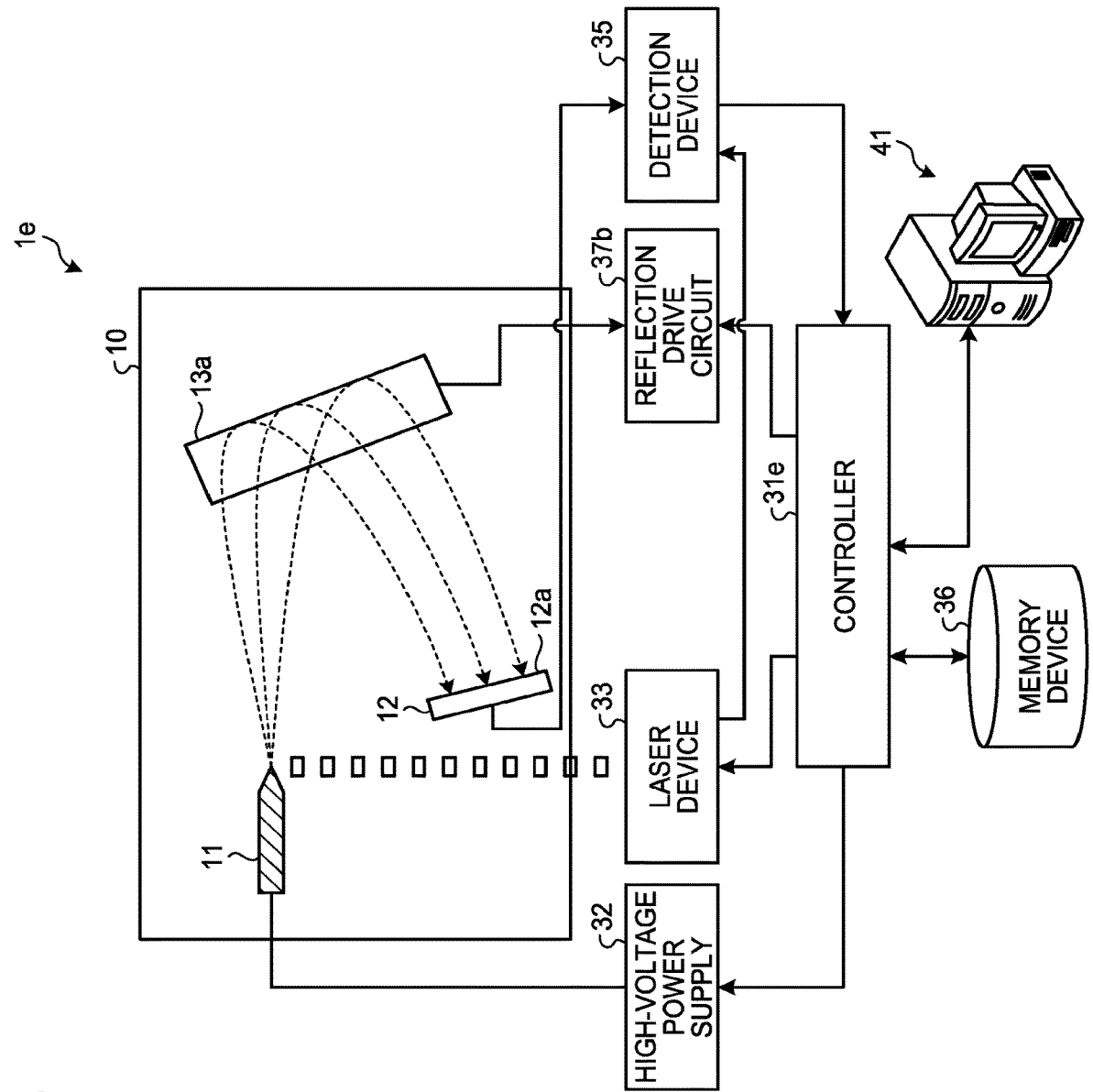
FIG. 23 is a diagram illustrating an exemplary configuration of the atom probe inspection device according to a third modification of the second embodiment.

FIG. 23 is a diagram illustrating an exemplary configuration of the atom probe inspection device according to the third modification of the second embodiment. The entire configuration of an atom probe inspection device 1e according to this modification is described with reference to FIG. 23.

As illustrated in FIG. 23, the atom probe inspection device 1e according to this modification includes the position sensitive detector 12, a reflection lens 13a, a controller 31e, the high-voltage power supply 32, the laser device 33, the detection device 35, a reflection drive circuit 37b, and the memory device 36. Further, the operations of the position sensitive detector 12, the high-voltage power supply 32, the laser device 33, the detection device 35, and the memory device 36 are similar to those of the second embodiment.

The reflection lens 13a is an electrooptical device which generates a given electric field to cause the flying ion to return the trajectory and travel in a different direction. Specifically, the reflection lens 13a returns the trajectory of the flying ion so as to fly toward the position sensitive detector 12. The reflection lens 13a is, for example, a device corresponding to a reflection mirror of an optical system.

The controller 31e controls the entire atom probe inspection device 1e. Specifically, the controller 31e controls the operations of the high-voltage power supply 32, the laser device 33, and the reflection drive circuit 37b, and calculates a distribution (positions) of the atoms on the surface of the sample 11 from the information detected by the detection device 35 to reconstruct an image. In addition, the controller 31e arranges the images of the distribution of the atoms on the surface of the sample 11 chronologically so as to generate a three-dimensional map representing the three-dimensional distribution of atoms of the sample 11. A hardware configuration of the controller 31e is similar to that of the controller 31 illustrated in FIG. 3.

The reflection drive circuit 37b is a drive circuit to apply a current or a voltage to the reflection lens 13a to generate an electric field.

Figure 24:
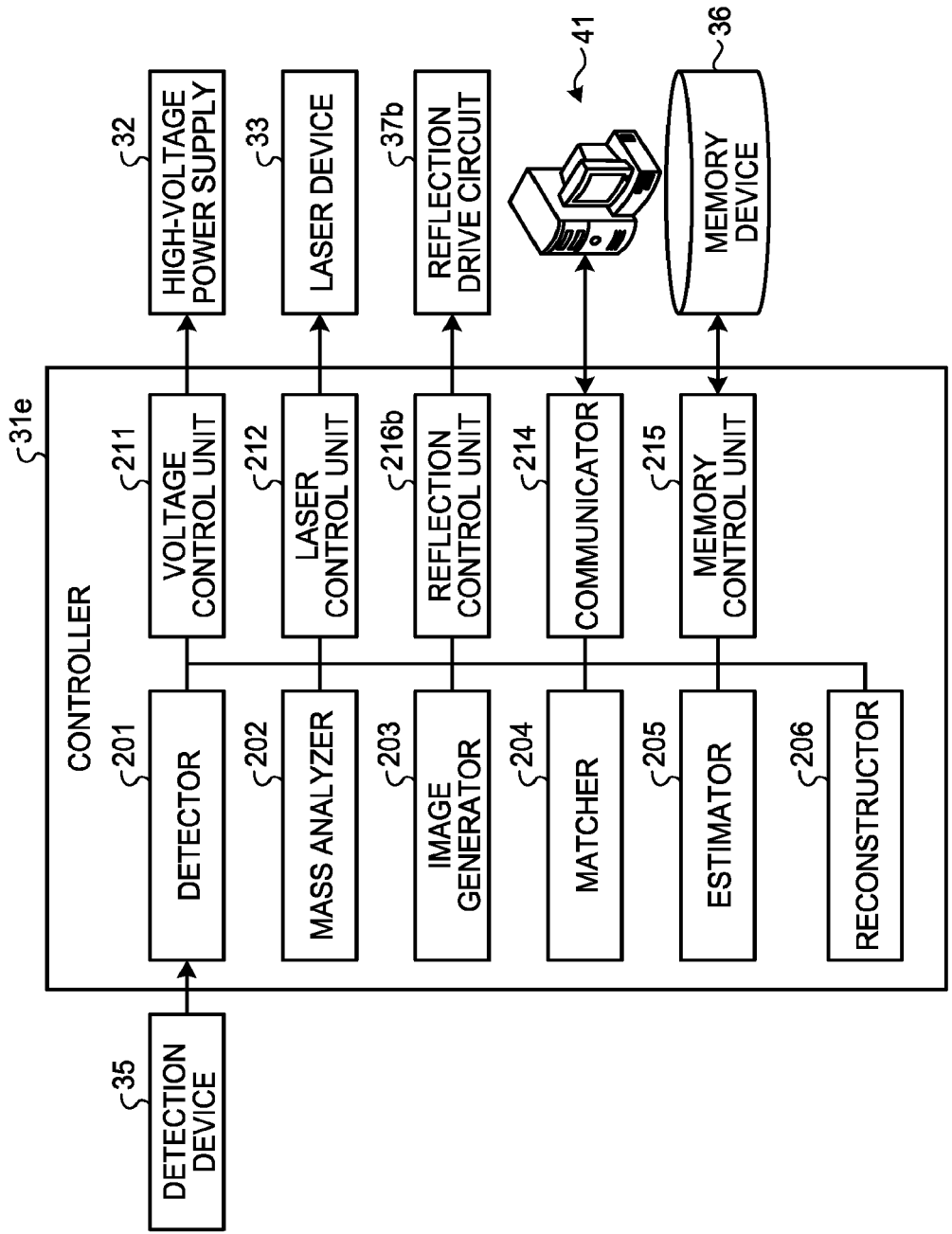
FIG. 24 is a diagram illustrating an exemplary configuration of functional blocks of the controller in the third modification of the second embodiment.

FIG. 24 is a diagram illustrating an exemplary configuration of functional blocks of the controller in the third modification of the second embodiment. The configuration and the operation of the functional blocks of the controller 31e in this modification will be described with reference to FIG. 24.

As illustrated in FIG. 24, the controller 31e according to this modification includes the detector 201, the mass analyzer 202, the image generator 203, the matcher 204, the estimator 205, the reconstructor 206, the voltage control unit 211, the laser control unit 212, the communicator 214, the memory control unit 215, and a reflection control unit 216b. Further, the operations of the detector 201, the mass analyzer 202, the image generator 203, the matcher 204, the estimator 205, the reconstructor 206, the voltage control unit 211, the laser control unit 212, the communicator 214, and the memory control unit 215 are similar to those described in FIG. 4. These units represent commands stored in a storage medium to be read by an integrated circuit and/or a computer and executable by the CPU or one or more processors, and part of them may execute the following processing.

The reflection control unit 216b is a functional unit which controls the operation of the reflection drive circuit 37b to control the forming of the electric field by the reflection lens 13a. The reflection control unit 216b is implemented by the CPU 101's executing the program illustrated in FIG. 3.

Further, part or all of the detector 201, the mass analyzer 202, the image generator 203, the matcher 204, the estimator 205, the reconstructor 206, the voltage control unit 211, the laser control unit 212, and the reflection control unit 216b may be implemented by hardware circuitry such as FPGA or ASIC instead of a software program.

The functional units of the controller 31e illustrated in FIG. 24 are conceptual functions, and are not limited to such a configuration. For example, the plurality of functional units as independent functional units in the controller 31e illustrated in FIG. 24 may be one functional unit. Alternatively, the function of one functional unit in the controller 31e illustrated in FIG. 24 may be divided into a plurality of functions serving as a plurality of functional units.

Figure 25:
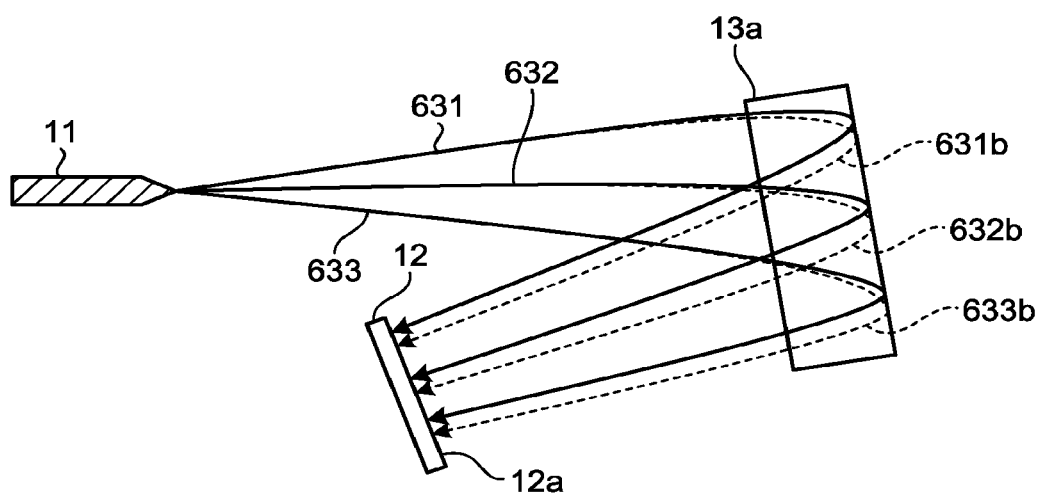
FIG. 25 is a diagram for illustrating an operation of changing a trajectory by the reflection lens in the third modification of the second embodiment.

FIG. 25 is a diagram for illustrating an operation of changing the trajectory by the reflection lens in the third modification of the second embodiment. The description will be given about the operation of changing the trajectory by the reflection lens 13a in the atom probe inspection device 1e according to this modification with reference to FIG. 25.

As illustrated in FIG. 25, in a certain electric field of the reflection lens 13a (an exemplary first condition), the ions, separated by the electric field evaporation from the sample 11 along the tacks 631 to 633, are reflected to the position sensitive detector 12 by the electric field of the reflection lens 13a along the trajectories 631 to 633, and detected on the detection surface 12a. In this case, as illustrated in FIG. 9, in the case of the sample 11 of a shape with difference in local magnification (different curvature) at each position of the surface from the spherical crown shape, the ion detected at a certain position of the detection surface 12a is estimated as having flown from the center of the circle along the spherical crown shape although the ion has actually flown from the point on the curvature circle with the center different from that of the circle along the spherical crown shape. That is, the position of the atom (the base of the ion) on the sample 11 is at the point on the curvature circle, however, is erroneously reconstructed by the image generator 203 such that the atom is on the circle along the spherical crown. As a result, a reconstruction image containing a distortion is generated.

Next, in an electric field of a different magnitude from the certain electric field generated by the reflection lens 13a (an exemplary second condition), the ions separated by the electric field evaporation from the sample 11 along the trajectories 631 to 633 up to the reflection lens 13a are reflected along the trajectories 631b to 633b by the electric field having the different magnitude from the certain electric field generated by the reflection lens 13a toward the position sensitive detector 12, and detected by the detection surface 12a. Similarly even in this case, the ion detected at a certain position of the detection surface 12a is estimated as flying from the center of the circle along the spherical crown shape although the ion flies from the point on the curvature circle with the center different from that of the circle along the spherical crown shape. Then, the position on the sample 11 of the atom (the base of the ion) is erroneously reconstructed by the image generator 203 such that the atom is on the circle along the spherical crown shape regardless of that the atom is at the point on the curvature circle. As a result, a reconstruction image containing a distortion different from the one in the certain electric field of the reflection lens 13a is obtained.

Then, the matcher 204 performs the feature matching of two images obtained as the reconstruction image which contains a distortion different from the original distribution of atoms. With the feature matching, it is possible to associate the positions of the boundaries between both materials of two images. With the feature matching, it is possible to associate the positions of the boundaries of the image portions corresponding to a plurality of materials. Then, on the basis of the result of the feature matching, the estimator 205 calculates the distortion amount of the corresponding locations (for example, the boundary of the materials) in two reconstruction images, and calculates the trajectory of the ion from the distortion amount to estimate the center of the curvature circle at the point on the sample 11 from which the ion corresponding to the location has been separated. Lastly, the reconstructor 206 corrects the distortion by the reconstruction using the center (estimated by the estimator 205) of curvature circle at the point on the sample 11 from which the ion has been separated, to generate the reconstruction image having no error caused by the local magnification.

As described above, the reflection lens 13a generates the electric field instead of the magnetic field by the electromagnetic lens 14 to return the trajectory of the ion, to be able to detect the ion, separated from the same position on the sample 11, at a different position on the detection surface 12a. Thereby, two reconstruction images containing distortion can be generated to be able to identify corresponding distorted locations through the feature matching. Then, the distortion amount of the corresponding locations is calculated. The trajectory of the ion is calculated from the distortion amount. Thus, the center of the curvature circle at the point on the sample 11 from which the ion corresponding to the location has been separated is estimated. The distortion is corrected by the reconstruction using the estimated center of the curvature circle at the point on the sample 11 from which the ion has been separated. Thus, the reconstruction image having no error caused by the local magnification is obtained. With this configuration, it is possible to correct the distortion, caused by the local magnification of the sample 11, of the image reconstructed at the position (distribution) of the atom of the sample 11.

Further, in this modification, the electric field of the reflection lens 13a is set to two magnitudes, and the detection information detected at each electric field is used, but the invention is not limited thereto. The electric field of the reflection lens 13a may be set to three or more magnitude, and the detection information detected at each electric field may be used.

With a change in the magnitude of the electric field of the reflection lens 13a to change the trajectory of the ion, the trajectory of the ion may deviate from the detection surface 12a of the position sensitive detector 12, lowering the yield. Thus, it is desirable to use the reflection lens 13a in combination with a corrector to correct this defect, as in the first modification of the first embodiment.

In the embodiments and modifications, the operations are explained with the sample 11 that is fixed, but the embodiments and modifications are not limited thereto. It is allowable to move the sample 11.

Further, the program executed by the atom probe inspection devices or the field ion microscopes (FIM) of the embodiments and the modifications may be incorporated and provided in a ROM, for example.

The program executed by the atom probe inspection devices or the field ion microscopes (FIM) of the embodiments and the modifications may be recorded in installable format or executable file format on a computer-readable recording medium such as a compact disc-read only memory (CD-ROM), a flexible disk (FD), a compact disc-recordable (CD-R), and a digital versatile disc (DVD), and may be provided as a computer program product.

The program executed by the atom probe inspection devices or the field ion microscopes (FIM) of the embodiments and modifications may be stored on a computer connected to a network such as the Internet, and may be provided by being downloaded through the network. In addition, the program executed by the atom probe inspection devices or the field ion microscopes (FIM) of the embodiments and the modifications may be provided or distributed through the network such as the Internet.

The program executed by the atom probe inspection devices or the field ion microscopes (FIM) of the embodiments and the modifications may cause a computer to function as the above functional units. In the computer, the CPU or one or more processors read and execute the program from a computer-readable storage medium onto a main memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An atom probe inspection device, comprising one or more processors configured to:
    change, between a first condition and a second condition, a two-dimensional position at which an ion that has been separated from a surface of a sample is detected on a detection surface of a position sensitive detector;
    detect two-dimensional position information of the ion detected on the detection surface and a flying time of the ion from the sample to the detection surface;
    identify a type of an element of the ion detected on the detection surface from the detected flying time;
    generate first information on the basis of a first two-dimensional position detected under the first condition and the type of the element and generate second information on the basis of a second two-dimensional position detected under the second condition and the type of the element; and
    generate a reconstruction image of the sample by estimating a center of a curvature circle contacting a point on the sample from which the ion has been separated, on the basis of an amount of distortion of corresponding locations on the first information and the second information.

2. The atom probe inspection device according to claim 1, wherein the one or more processors:
    perform feature matching between the first information generated and the second information generated, and
    estimate information on an actual position of the ion separated from the surface of the sample from a result of the feature matching.

3. The atom probe inspection device according to claim 1, wherein
    the one or more processors generate the reconstruction image to reflect an atomic arrangement of an actual element on the surface of the sample, on the basis of the type of the element, the first information, and the second information.

4. The atom probe inspection device according to claim 1, wherein the one or more processors:
generate a plurality of reconstruction images of the sample on the basis of the first information generated and the second information generated, and
arrange the generated reconstruction images chronologically to generate a three-dimensional map representing a three-dimensional distribution of atoms.

5. The atom probe inspection device according to claim 1, wherein
the one or more processors label the identified type of each of the first information generated and the second information generated.

6. The atom probe inspection device according to claim 1, wherein
the one or more processors calculate a ratio between a mass number and a charge number of the ion from the flying time, and identify the type in accordance with the ratio.

7. The atom probe inspection device according to claim 1, further comprising:
a power supply which applies a voltage to the sample; and
a laser device which emits a laser to the sample.

8. The atom probe inspection device according to claim 7, wherein
the laser device emits a pulse laser to the sample.

9. The atom probe inspection device according to claim 8, wherein
the power supply applies the voltage to generate an electric field smaller than an evaporation electric field of the sample between the sample and the position sensitive detector.

10. The atom probe inspection device according to claim 1, wherein the one or more processors:
control movement of the position sensitive detector to change a distance between the sample and the position sensitive detector, and
generate the first information at a first position under the first condition that the position sensitive detector is moved, and
generate the second information at a second position different from the first position under the second condition that the position sensitive detector is moved to the second position.

11. The atom probe inspection device according to claim 10, wherein
the one or more processors move the position sensitive detector in a linear direction from an end of the sample to a center of the detection surface, to change a distance from the end to the detection surface of the position sensitive detector.

12. The atom probe inspection device according to claim 1, further comprising
an electromagnetic lens which generates a magnetic field to change a trajectory of an ion separated from the sample, wherein the one or more processors:
control generation of a magnetic field by the electromagnetic lens,
generate the first information under the first condition that the electromagnetic lens is controlled to generate a certain magnetic field, and
generate the second information under the second condition that the electromagnetic lens is controlled to generate a different magnetic field from the certain magnetic field.

13. The atom probe inspection device according to claim 1, wherein the one or more processors:
control generation of an electric field by a drive circuit to change a trajectory of the ion separated from the sample by the electric field,
generate the first information under the first condition that the drive circuit is controlled to generate a certain electric field, and
generate the second information under the second condition that the drive circuit is controlled to generate a different electric field from the certain electric field.

14. An atom probe inspection device, comprising:
one or more processors configured to:
change, between a first condition and a second condition, a two-dimensional position at which an ion that has been separated from a surface of a sample is detected on a detection surface of a position sensitive detector;
detect two-dimensional position information of the ion detected on the detection surface and a flying time of the ion from the sample to the detection surface;
identify a type of an element of the ion detected on the detection surface from the detected flying time;
generate first information on the basis of a first two-dimensional position detected under the first condition and the type of the element and generate second information on the basis of a second two-dimensional position detected under the second condition and the type of the element; and
generate a reconstruction image of the sample on the basis of the first information generated and the second information generated; and
a reflection lens which generates an electric field to reflect a trajectory of the ion separated from the sample and causes the ion to fly toward the position sensitive detector, wherein the one or more processors are further configured to:
control a position of the reflection lens, and
generate the first information at a first position under the first condition that the reflection lens is moved to the first position, and
generate the second information at a second position different from the first position under the second condition that the reflection lens is moved to the second position.

15. An atom probe inspection device, comprising
one or more processors configured to:
change, between a first condition and a second condition, a two-dimensional position at which an ion that has been separated from a surface of a sample is detected on a detection surface of a position sensitive detector;
detect two-dimensional position information of the ion detected on the detection surface and a flying time of the ion from the sample to the detection surface;
identify a type of an element of the ion detected on the detection surface from the detected flying time;
generate first information on the basis of a first two-dimensional position detected under the first condition and the type of the element and generate second information on the basis of a second two-dimensional position detected under the second condition and the type of the element; and generate a reconstruction image of the sample on the basis of the first information generated and the second information generated; and a reflection lens which generates an electric field to reflect a trajectory of the ion separated from the sample to cause the ion to fly toward the position sensitive detector, wherein the one or more processors are further configured to:

control generation of the electric field by the reflection lens, generate the first information under the first condition that the reflection lens is controlled to generate a certain electric field, and generate the second information under the second condition that the reflection lens is controlled to generate a different electric field from the certain electric field.

16. A field ion microscope, comprising
one or more processors configured to:

change, between a first condition and a second condition, a two-dimensional position at which an ion that has been separated from a surface of a sample is detected on a detection surface of a position sensitive detector;

detect two-dimensional position information of the ion detected on the detection surface;

generate first information on the basis of a first two-dimensional position detected under the first condition and generate second information on the basis of a second two-dimensional position detected wider the second condition; and generate a reconstruction image of the sample by estimating a center of a curvature circle contacting a point on the sample from which the ion has been separated, on the basis of an amount of distortion of corresponding locations on the first information and the second information.

17. The field ion microscope according to claim 16, wherein the one or more processors:

generate a plurality of reconstruction images of the sample on the basis of the first information generated and the second information generated, and arrange the generated reconstruction images chronologically to generate a three-dimensional map representing a three-dimensional distribution of atoms.

18. A distortion correction method, comprising:

changing, between a first condition and a second condition, a two-dimensional position at which an ion that has been separated from a surface of a sample is detected on a detection surface of a position sensitive detector;

detecting two-dimensional position information of the ion detected on e detection surface and a flying time of the ion from the sample to the detection surface;

identifying a type of an element of the ion detected on the detection surface from the detected flying time;

generating first information on the basis of a first two-dimensional position detected under the first condition and the type of the element and generating second information on the basis of a second two-dimensional position detected under the second condition and the type of the element; and generating a reconstruction image of the sample by estimating a center of a curvature circle contacting a point on the sample from which the ion has been separated, on the basis of an amount of distortion of corresponding locations on the first information and the second information.

* * * * *